(12) United States Patent
Antoku et al.

(10) Patent No.: US 11,353,526 B2
(45) Date of Patent: Jun. 7, 2022

(54) ROTATIONAL ANGLE DETECTION DEVICE

(71) Applicant: TDK Corporation, Tokyo (JP)

(72) Inventors: Yosuke Antoku, Tokyo (JP); Hiroyuki Hirano, Tokyo (JP); Teiichiro Oka, Tokyo (JP)

(73) Assignee: TDK Corporation, Tokyo (JP)

( * ) Notice: Subject to any disclaimer, the term of this patent is extended or adjusted under 35 U.S.C. 154(b) by 134 days.

(21) Appl. No.: 16/750,124

(22) Filed: Jan. 23, 2020

(65) Prior Publication Data

US 2020/0300941 A1 Sep. 24, 2020

(30) Foreign Application Priority Data

Mar. 20, 2019 (JP) .............................. JP2019-052259

(51) Int. Cl.
| | | |
|---|---|---|
| *G01R 33/09* | (2006.01) | |
| *G01D 5/14* | (2006.01) | |
| *G01R 33/00* | (2006.01) | |
| *G01R 33/07* | (2006.01) | |
| *G01D 5/244* | (2006.01) | |

(52) U.S. Cl.
CPC ........... *G01R 33/093* (2013.01); *G01D 5/145* (2013.01); *G01D 5/24485* (2013.01); *G01R 33/0094* (2013.01); *G01R 33/072* (2013.01)

(58) Field of Classification Search
CPC .............................. G01R 33/093; G01D 5/145
See application file for complete search history.

(56) References Cited

U.S. PATENT DOCUMENTS

| 5,363,034 | A | 11/1994 | Tada et al. | |
|---|---|---|---|---|
| 8,836,326 | B2* | 9/2014 | Maeda | ................... H02K 29/08 |
| | | | | 324/207.25 |
| 8,909,489 | B2 | 12/2014 | Saruki et al. | |
| 10,670,425 | B2* | 6/2020 | Ruigrok | ................. G01D 5/145 |
| 2009/0115409 | A1 | 5/2009 | Arinaga et al. | |
| 2009/0206827 | A1 | 8/2009 | Aimuta et al. | |
| 2010/0026282 | A1 | 2/2010 | Kaita et al. | |
| 2011/0156505 | A1 | 6/2011 | Miyashita et al. | |

(Continued)

FOREIGN PATENT DOCUMENTS

| DE | 102013104783 A1 | 11/2013 |
|---|---|---|
| EP | 2888558 A1 | 7/2015 |

(Continued)

*Primary Examiner* — Reena Aurora
(74) *Attorney, Agent, or Firm* — Posz Law Group, PLC

(57) ABSTRACT

A rotational angle detection device includes a magnet with n pole pairs (where n≥3) provided to be integrally rotatable with a rotating body; magnetic detection parts including first and second magnetic detection parts; a corrected signal generation part generating first and second corrected signals; and a rotational angle detection part detecting the rotational angle of the rotating body based on the first and second corrected signals. The waveform of the first and second detection signals have a phase difference of 90° from each other. The corrected signal generation part adds the first sensor signals and adds the second sensor signals. The region at the perimeter of the magnet includes first through nth regions, and at least two of the first and second magnetic sensor parts are positioned in different regions from each other among the first through nth regions.

7 Claims, 13 Drawing Sheets

(56) References Cited

U.S. PATENT DOCUMENTS

| | | | |
|---|---|---|---|
| 2015/0226581 A1* | 8/2015 | Schott | G01D 5/145 324/207.2 |
| 2017/0370747 A1 | 12/2017 | Uchida et al. | |
| 2019/0041240 A1 | 2/2019 | Kuwahara | |
| 2020/0271479 A1* | 8/2020 | Wang | G01D 5/145 |
| 2020/0370924 A1* | 11/2020 | Bilbao De Mendizabal | G01D 18/008 |

FOREIGN PATENT DOCUMENTS

| | | |
|---|---|---|
| JP | H4-43915 A | 2/1992 |
| JP | 5110134 B2 | 3/2012 |
| JP | 2017-227578 A | 12/2017 |
| WO | 2014029885 A1 | 2/2014 |
| WO | 2018/016145 A1 | 1/2018 |

\* cited by examiner

ROTATIONAL ANGLE DETECTION DEVICE

The present application is based on Japanese Patent Application No. 2019-052259 filed on Mar. 20, 2019, the disclosure of which is incorporated herein by reference.

TECHNICAL FIELD

The present invention relates to a rotational angle detection device.

BACKGROUND

In recent years, so-called magnetic angle sensors that generate angle detection values having a correspondence with a target object have become widely used for a variety of applications, such as detecting the rotational position of a steering wheel or power steering motor in an automobile. In angle sensor systems in which magnetic angle sensors are used, typically a magnetic field generator that generates a rotational magnetic field the direction of which rotates in conjunction with rotation or linear movement of the target object is provided. The magnetic field generator can be configured by multipolar magnets in which a plurality of magnetic poles (N poles and S poles) is arranged alternately in the circumferential direction. The angle of the target object in the magnetic angle sensor has a correspondence with the angle formed by the direction of a magnetic field that changes through rotation of the magnetic field generator (multipolar magnet) at a reference position, with respect to a reference direction.

As the magnetic angle sensor, one that is provided with a plurality of detection circuits that generates a plurality of detection signals with mutually different phases, and that generates an angle detection value through computations using the plurality of detection signals is known (see Patent Literature 1). Each of the plurality of detection circuits includes at least one magnetic detection element. The magnetic detection element includes, for example, a spin-valve-type magnetoresistive element (a GMR, element, TMR element or the like) having a magnetization fixed layer in which the magnetization direction is fixed, a free layer in which the direction of magnetization changes in accordance with the direction of the rotating magnetic field, and a nonmagnetic layer positioned between the magnetization fixed layer and the free layer.

In the magnetic angle sensor, when the direction of the rotating magnetic field changes with a predetermined frequency, the waveform of each of the plurality of detection signals ideally becomes a sine curve (including sine waveforms and cosine waveforms). Each of the detection signals includes an ideal component that changes so that the ideal sine curve is drawn. Along with this, each of the detection signals may include one or a plurality of error components equivalent to one or a plurality of harmonic waves with regards to the ideal components. The angle detection value computed by the angle sensor when each detection signal is composed only of ideal components corresponds to the true angle of the target object, but when each detection signal includes error components and the waveform thereof is distorted from a sine curve, errors occur in the angle detection value. In order to prevent these kinds of errors in the angle detection value from occurring, it should be reduced the error components included in each detection signal.

As an angle sensor capable of reducing the above-described error components, conventionally, an angle sensor, in which first through eighth detection signal generators that generate first through eighth detection signals are positioned at predetermined angular spacing, generates a signal with reduced error components corresponding to harmonic waves and calculates the angle detection value based on the signal is known.

RELATED LITERATURE

Patent Literature

[PATENT LITERATURE 1] Japanese Patent No. 5110134
[PATENT LITERATURE 2] JP Laid-Open Patent Application No. 2017-227578

OVERVIEW OF THE INVENTION

Problem to be Solved by the Invention

In the above-described Patent Literature 2, in order to reduce error components corresponding to nth-order (for example, 5th order) harmonic waves, first through eighth detection signal generators are positioned so that the phase difference between the first detection signal and the third detection signal, the phase difference between the second detection signal and the fourth detection signal, the phase difference between the fifth detection signal and the seventh detection signal, and the phase difference between the sixth detection signal and the eighth detection signal are each $180/n°$, and the sum of the first detection signal and the third detection signal, the sum of the second detection signal and the fourth detection signal, the sum of the fifth detection signal and the seventh detection signal, and the sum of the sixth detection signal and the eighth detection signal are calculated.

In addition, in order to reduce error components corresponding to mth-order (for example, 3rd order) harmonic waves, the first through eighth detection signal generators are positioned so that the phase difference between the first detection signal and the fifth detection signal, the phase difference between the second detection signal and the sixth detection signal, the phase difference between the third detection signal and the seventh detection signal, and the phase difference between the fourth detection signal and the eighth detection signal are each $180/m°$, and the sum of the first detection signal and the fifth detection signal, the sum of the second detection signal and the sixth detection signal, the sum of the third detection signal and the seventh detection signal, and the sum of the fourth detection signal and the eighth detection signal are calculated.

By positioning each of the detection signal generators and calculating as described above, it is possible to reduce error components corresponding to third-order harmonic waves and error components corresponding to fifth-order harmonic waves, and to calculate highly accurate angle detection values, but further, there is a demand for an angle sensor capable of detecting rotational angles with high accuracy.

In consideration of the foregoing, it is an object of the present invention to provide a rotational angle detection device capable of detecting rotational angles with high accuracy.

Means for Solving the Problem

In order to resolve the above-described problem, the present invention provides a rotational angle detection device including a magnet with n pole pairs (where n is an integer that is at least 3) provided to be integrally rotatable with a rotating body, with the different magnetic poles arranged alternately in the circumferential direction; magnetic detection parts, which are positioned in a region at the perimeter of the magnet and which output a first detection signal and a second detection signal that change in accordance with a magnetic field accompanying rotation of the magnet; a corrected signal generation part that generates a first corrected signal and a second corrected signal in which error components included in the first detection signal and the second detection signal, respectively, output by the magnetic detection parts are reduced; and a rotational angle detection part that detects the rotational angle of the rotating body on the basis of the first corrected signal and the second corrected signal. The magnetic detection parts include at least a first magnetic detection part that outputs the first detection signal and a second magnetic detection part that outputs the second detection signal. The waveform of the first detection signal and the waveform of the second detection signal have a phase difference of 90 degrees from each other. Each of the first magnetic detection part and the second magnetic detection part includes a plurality of first magnetic sensor parts and a plurality of second magnetic sensor parts. The corrected signal generation part adds first sensor signals output from each of the plurality of first magnetic sensor parts and adds second sensor signals output from each of the plurality of second magnetic sensor parts, and through this, reduces the error components included in each of the first detection signal and the second detection signal. The region at the perimeter of the magnet is divided into n sections along the circumference and includes first through nth regions arranged in order. At least two of the first magnetic sensor parts of the plurality of first magnetic sensor parts are positioned in different regions from each other among the first through nth regions, and at least two of the second magnetic sensor parts of the plurality of second magnetic sensor parts are positioned in different regions from each other among the first through nth regions.

In the above-described rotational angle detection device, n may be an integer that is at least 4. The first magnetic detection part and the second magnetic detection part may each include four of the first magnetic sensor parts and four of the second magnetic sensor parts. The four first magnetic sensor parts may be positioned in different regions from each other among the first through nth regions, and the four second magnetic sensor parts may be positioned in different regions from each other among the first through nth regions, or two of the first magnetic sensor parts selected from among the four first magnetic sensor parts may be positioned in one region among the first through nth regions, and two of the second magnetic sensor parts selected from among the four second magnetic sensor parts may be positioned in one region among the first through nth regions.

The plurality of first magnetic sensor parts may include at least one group of two first magnetic sensor parts positioned at an angular spacing of 60+360×X° (where X is an integer that is at least 0 and not more than n−1) in electrical angle. The plurality of second magnetic sensor parts may include at least one group of two second magnetic sensor parts positioned at an angular spacing of 60+360×X° (where X is an integer that is at least 0 and not more than n−1) in electrical angle.

The plurality of first magnetic sensor parts may include at least two groups of two first magnetic sensor parts positioned at an angular spacing of 60+360×X° (where X is an integer that is at least 0 and not more than n−1) in electrical angle. The plurality of second magnetic sensor parts may include at least two groups of two second magnetic sensor parts positioned at an angular spacing of 60+360×X° (where X is an integer that is at least 0 and not more than n−1) in electrical angle.

The plurality of first magnetic sensor parts may include at least one group of two first magnetic sensor parts positioned at an angular spacing of 36+360×Y° (where Y is an integer that is at least 0 and not more than n−1) in electrical angle. The plurality of second magnetic sensor parts may include at least one group of two second magnetic sensor parts positioned at an angular spacing of 36+360×Y° (where Y is an integer that is at least 0 and not more than n−1) in electrical angle.

In the above-described rotational angle detection device, each of the first magnetic sensor parts and the second magnetic sensor parts can include a plurality of magnetoresistive elements. The magnetoresistive elements may be Hall's elements, AMR elements, GMR elements or TMR elements.

Efficacy of the Invention

With the present invention, it is possible to provide a rotational angle detection device capable of detecting rotational angles with high accuracy.

BEST MEANS FOR IMPLEMENTING THE INVENTION

Figure 1:
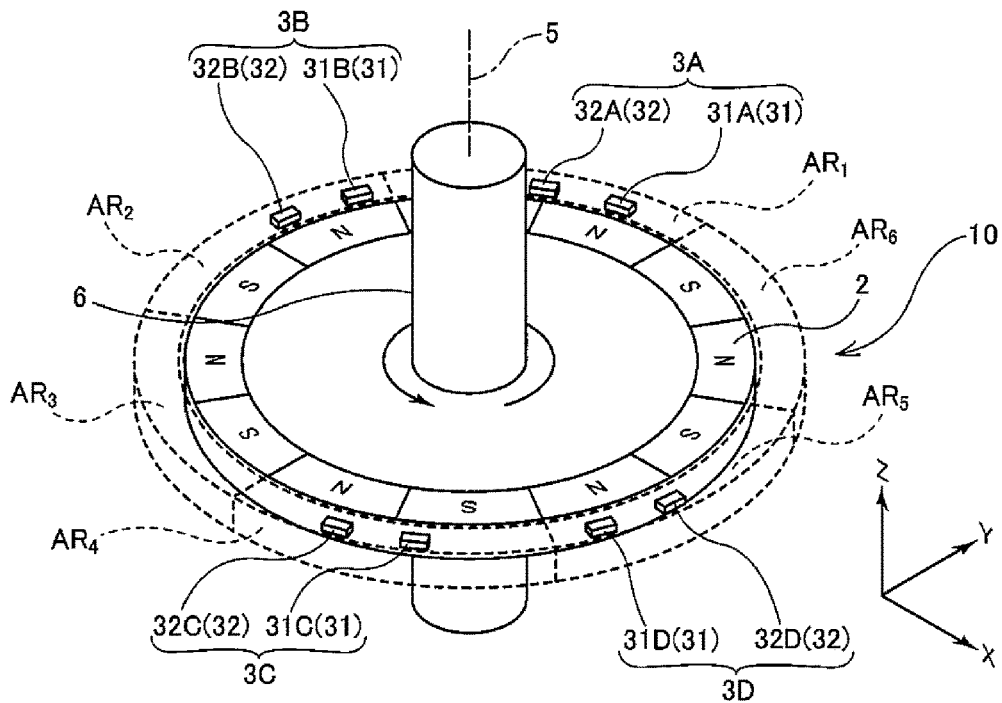
FIG. 1 is a perspective view showing the schematic configuration of a rotational angle detection device according to an embodiment of the present invention.
Figure 2:
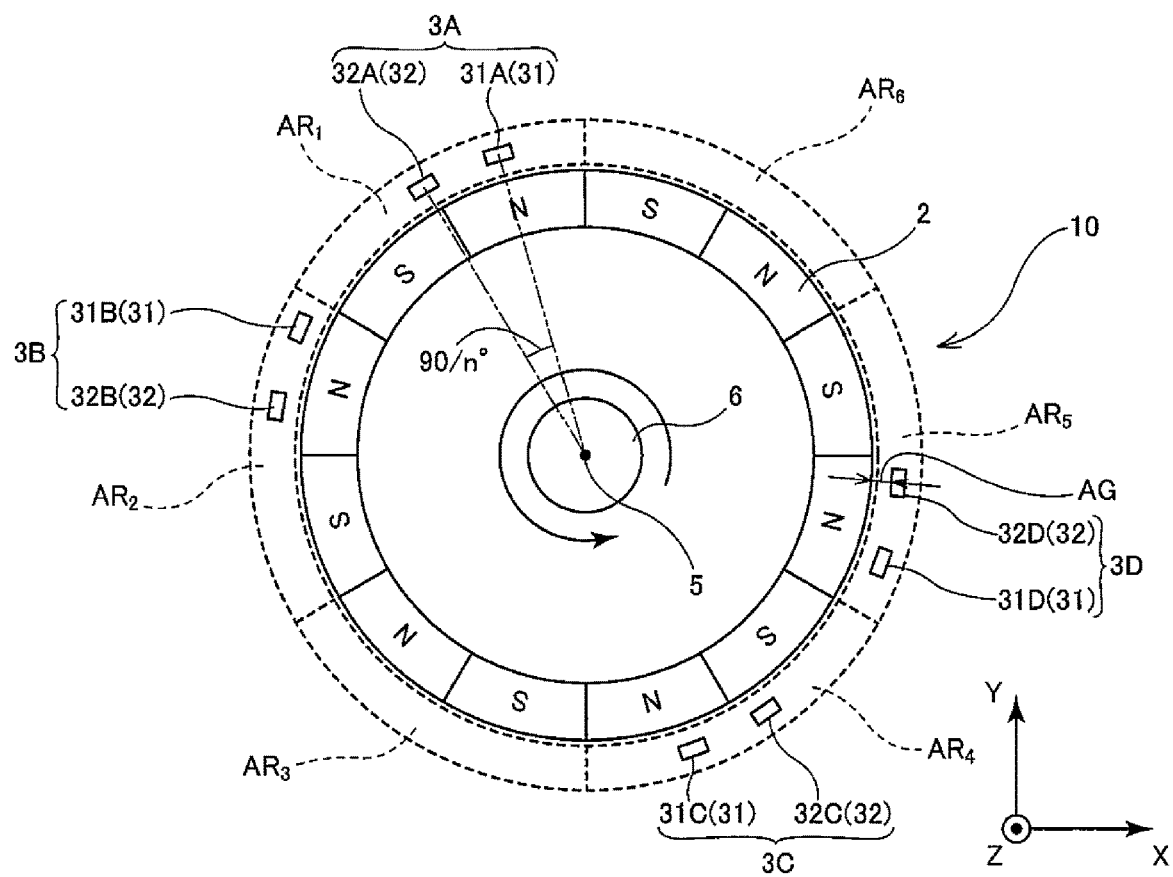
FIG. 2 is a top view showing the schematic configuration of one aspect of the rotational angle detection device according to the embodiment of the present invention.
Figure 3:
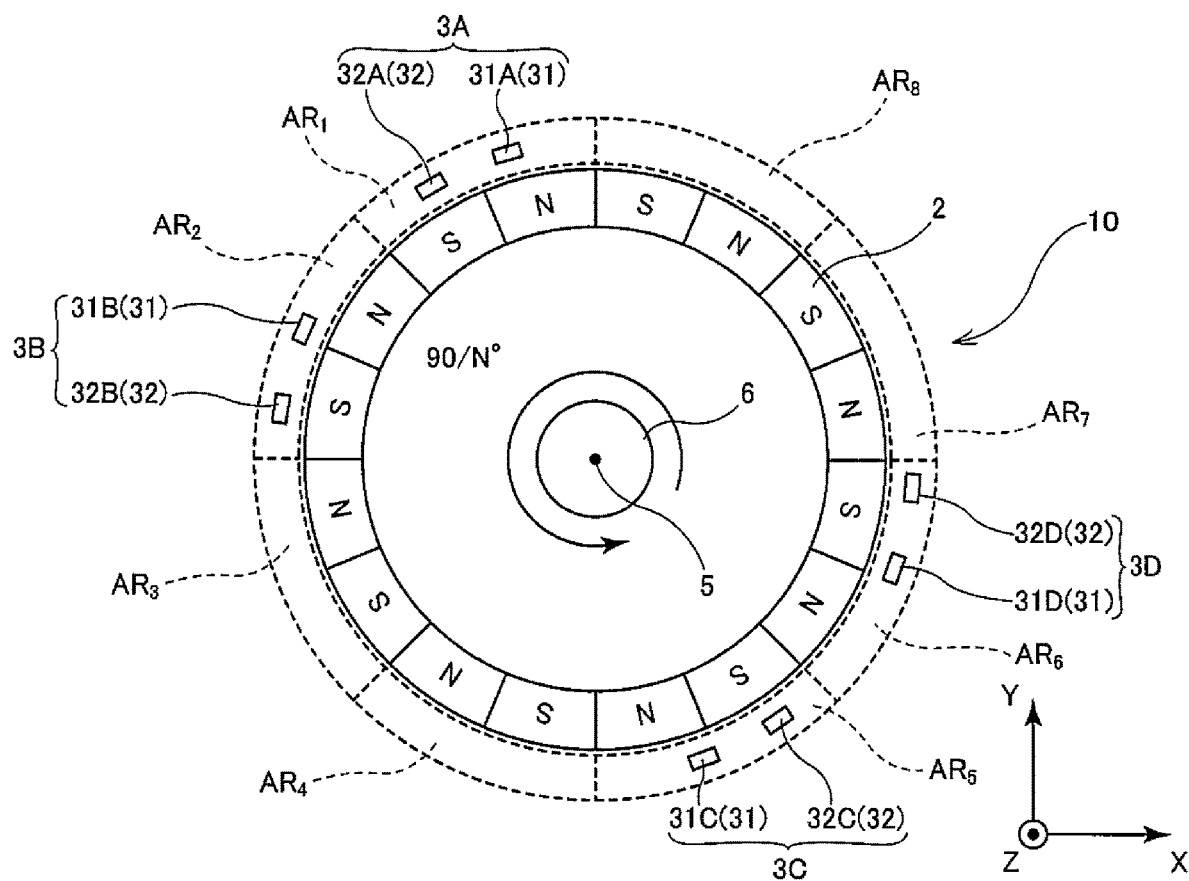
FIG. 3 is a top view showing the schematic configuration of the rotational angle detection device according to another embodiment of the present invention.
Figure 4:
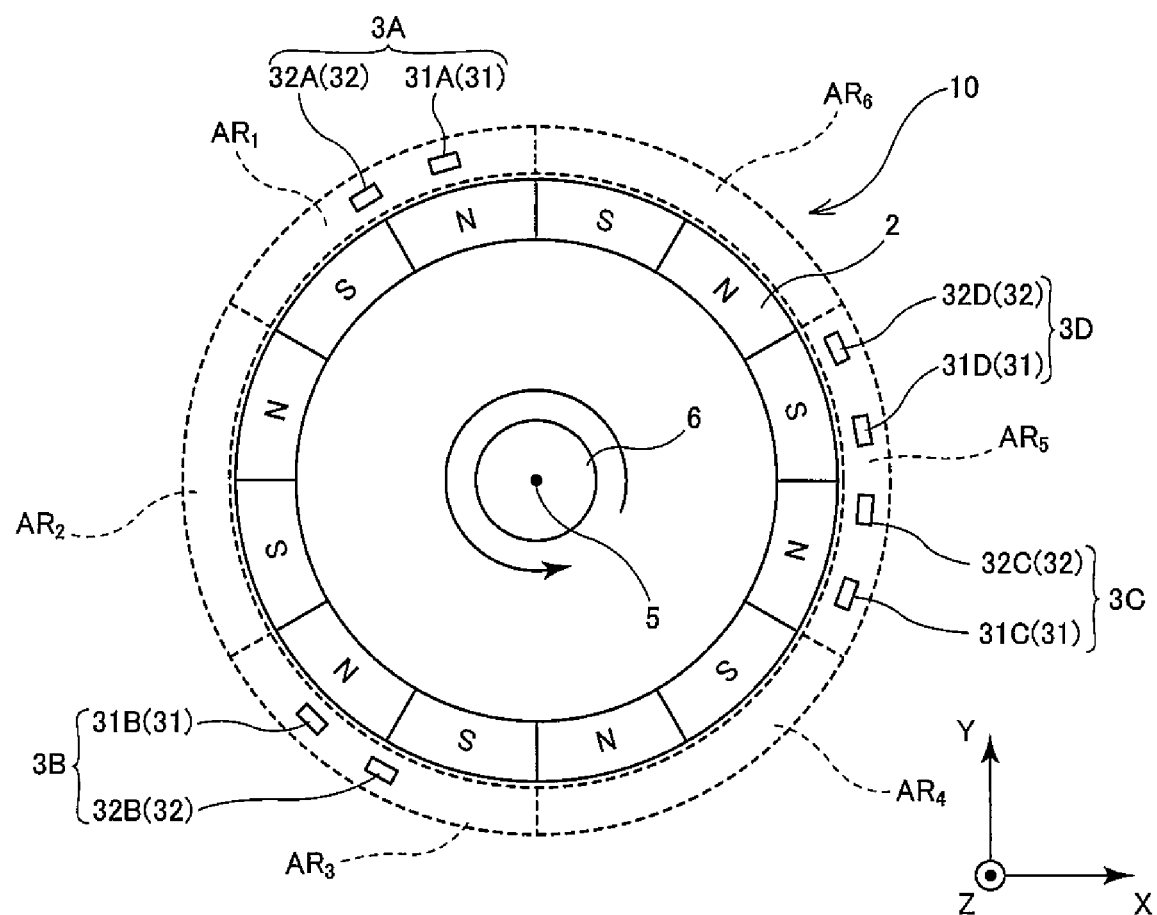
FIG. 4 is a top view showing the schematic configuration of another aspect (first) of the rotational angle detection device according to the embodiment of the present invention.
Figure 5:
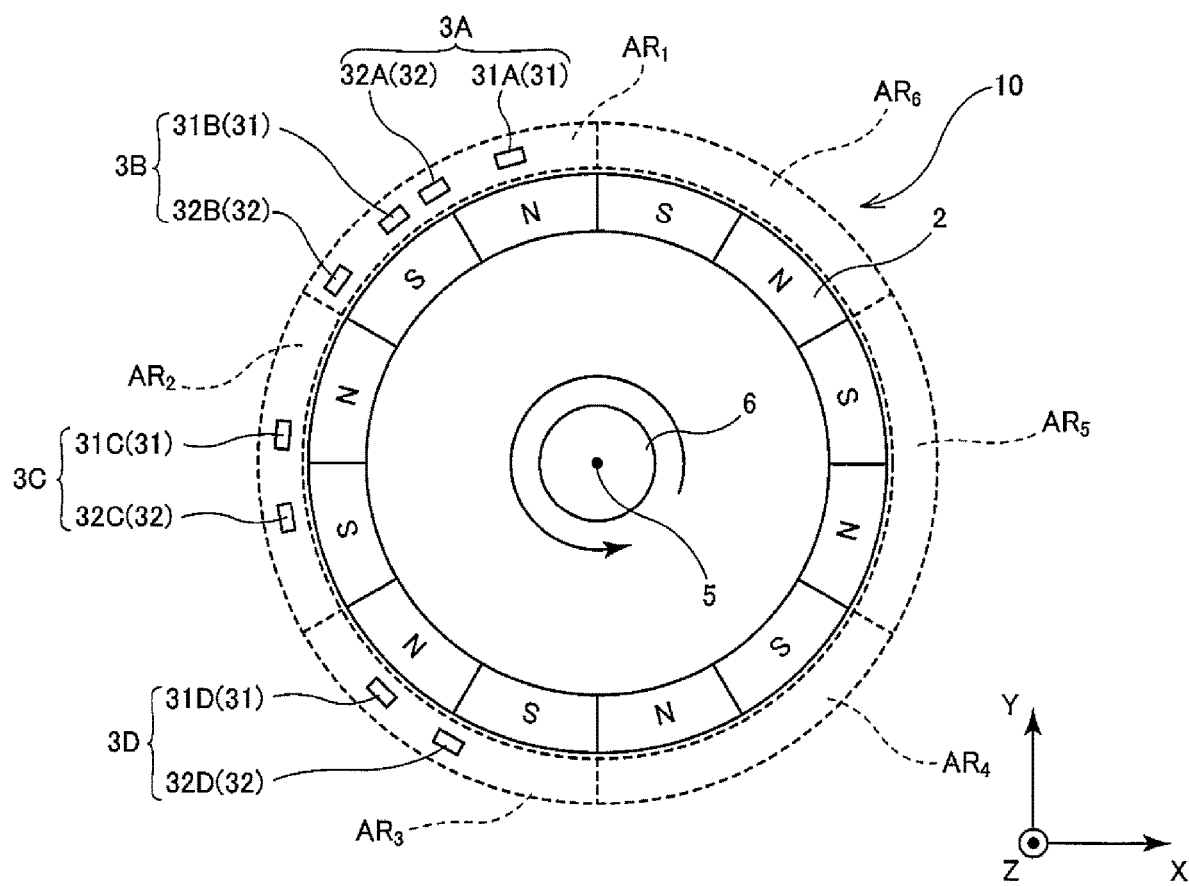
FIG. 5 is a top view showing the schematic configuration of another aspect (second) of the rotational angle detection device according to the embodiment of the present invention.
Figure 10:
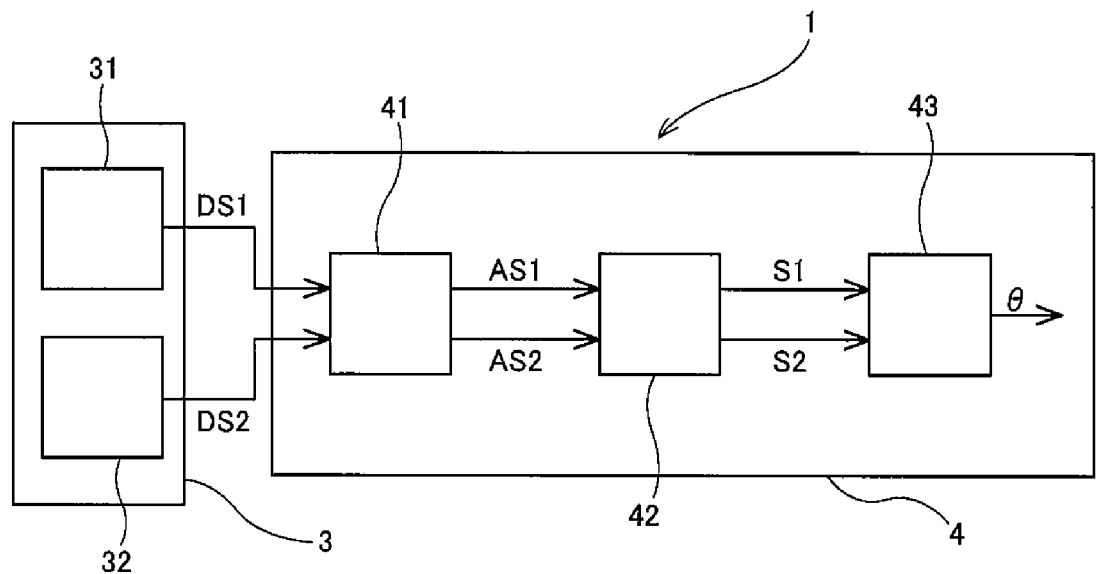
FIG. 10 is a block diagram showing the schematic configuration of a magnetic detection device according to the embodiment of the present invention.

An embodiment of the present invention will be described with reference to the drawings. FIG. 1 is a perspective view showing the schematic configuration of a rotational detection device according to this embodiment, FIG. 2 is a top view showing the schematic configuration of one aspect of the rotational angle detection device according to this embodiment, FIG. 3 is a top view showing the schematic configuration of the rotational detection device according to this embodiment, FIG. 4 and FIG. 5 are top views showing the schematic configuration of another aspect of the rotational detection device according to this embodiment, and FIG. 10 is a block diagram showing the schematic configuration of the rotational detection device according to this embodiment. In the rotational angle detection device according to this embodiment, "X-, Y- and Z-axis directions" are stipulated in a number of the drawings as necessary. Here, the X-axis direction and the Y-axis direction are directions orthogonal to each other within the plane of the multipolar magnet, and the Z-axis direction is the axial direction of the axis of rotation.

A rotational angle detection device 10 according to this embodiment is provided with a multipolar magnet 2 in which different magnetic poles (N poles and S poles) are alternately arranged in the circumferential direction, and a magnetic detection device 1 having a magnetic detection part 3 positioned facing the multipolar magnet 2 and an arithmetic processing part 4 (see FIG. 10).

The multipolar magnet 2 is provided to be rotatable about a shaft 6 centered on an axis of rotation 5 and rotates about the axis of rotation 5 in conjunction with rotation of the shaft 6. The multipolar magnet 2 includes a plurality of pairs of N poles and S poles (n pole pairs (where n is an integer that is at least 3, and preferably is an integer that is at least 6)), and the N poles and S poles are arranged alternately in a radial pattern (ring shape). The multipolar magnet 2 is a magnetic field generation means that generates a magnetic field based on the magnetization the magnet has. In this embodiment, the description will take as an example of the multipolar magnet 2 having six pole pairs (see FIG. 1 and FIG. 2), but it is not limited to this, for one having eight pole pairs would also be fine (see FIG. 3).

The magnetic detection part 3 has a first magnetic detection part 31 that includes four first magnetic sensor parts (No. 1-1 through No. 1-4 magnetic sensor parts 31A-31D), and a second magnetic detection part 32 that includes four second magnetic sensor parts (No. 2-1 through No. 2-4 magnetic sensor parts 32A-32D). The first magnetic detection part 31 outputs a first detection signal DS1 based on the change in the magnetic field accompanying the rotation of the multipolar magnet 2. The second magnetic detection part 32 outputs a second detection signal DS2 based on the change in the magnetic field accompanying the rotation of the multipolar magnet 2.

In this embodiment, four groups consisting of a first magnetic sensor set 3A that includes the No. 1-1 magnetic sensor part 31A and the No. 2-1 magnetic sensor part 32A, a second magnetic sensor set 3B that includes the No. 1-2 magnetic sensor part 31B and the No. 2-2 magnetic sensor part 32B, a third magnetic sensor set 3C that includes the No. 1-3 magnetic sensor part 31C and the No. 2-3 magnetic sensor part 32C, and a fourth magnetic sensor set 3D that includes the No. 1-4 magnetic sensor part 31D and the No. 2-4 magnetic sensor part 32D are respectively positioned in any of first through nth regions AR1~ARn established by partitioning the circumference of the multipolar magnet 2 into n pole pairs of the multipolar magnet 2 along the perimeter thereof. The first through nth regions AR1~ARn are established at the perimeter of the multipolar magnet 2 as regions of angular range including a pair of magnetic poles (N pole and S pole) of the multipolar magnet 2, that is, the regions in a 360° range in electrical angle.

The first through fourth sensor sets 3A~3D are positioned in any of the first through nth regions AR1~ARn to be arranged in order along the circumferential direction of the multipolar magnet 2 (in the rotational direction of the multipolar magnet 2 or the direction opposite thereto). In this embodiment, the first through sixth regions AR1~AR6 are established at the perimeter of the multipolar magnet 2 having six pole pairs, and at least two sets of magnetic sensor sets are positioned in mutually different regions among the first through sixth regions AR1~AR6. In the aspect shown in FIG. 1 and FIG. 2, all of the first through fourth magnetic sensor sets 3A~3D are positioned in the first region AR1, second region AR2, fourth region AR4 and fifth region AR5 that are different regions among the first through sixth regions AR1~AR6, and no magnetic sensor set is positioned in the third region AR3 or the sixth region AR6. However, it is not limited to this aspect, for it would be fine for two groups of magnetic sensor sets to be positioned in the same region among the first through fourth magnetic sensor sets 3A~3D and for the remaining two groups of magnetic sensor sets to be positioned in mutually different regions. For example, the first magnetic sensor set 3A may be positioned in the first region AR1, the second magnetic sensor set 3B in the third region AR3, and two groups of magnetic sensor sets (the third magnetic sensor set 3C and the fourth magnetic sensor set 3D) in the fifth region AR5 (see FIG. 4). In addition, the first through fourth magnetic sensor sets 3A~3D may be positioned only in a semicircular region around the shaft 6 in a plan view. For example, the first through fourth magnetic sensor sets 3A~3D may be positioned in the first through third regions AR1~AR3 (see FIG. 5). By positioning the first through fourth magnetic sensor sets 3A~3D in this manner, it is possible to mount each of the magnetic sensor sets 3A~3D on one roughly semicircular substrate, so it is possible to reduce manufacturing costs of the rotational angle detection device 10 and products in which this is assembled, and to increase the convenience thereof.

Figure 6:
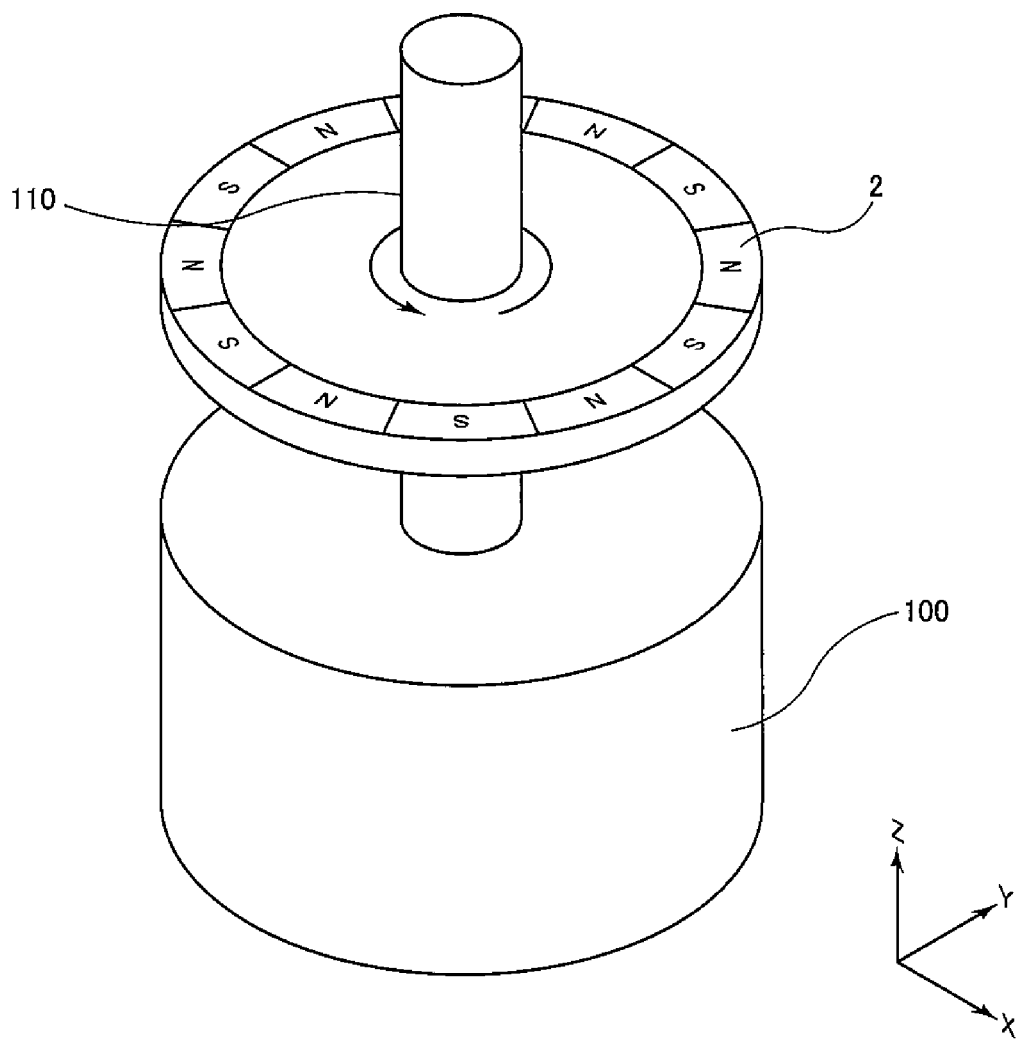
FIG. 6 is a perspective view showing a first step of a procedure for assembling the rotational angle detection device according to the embodiment of the present invention into a motor.
Figure 7:
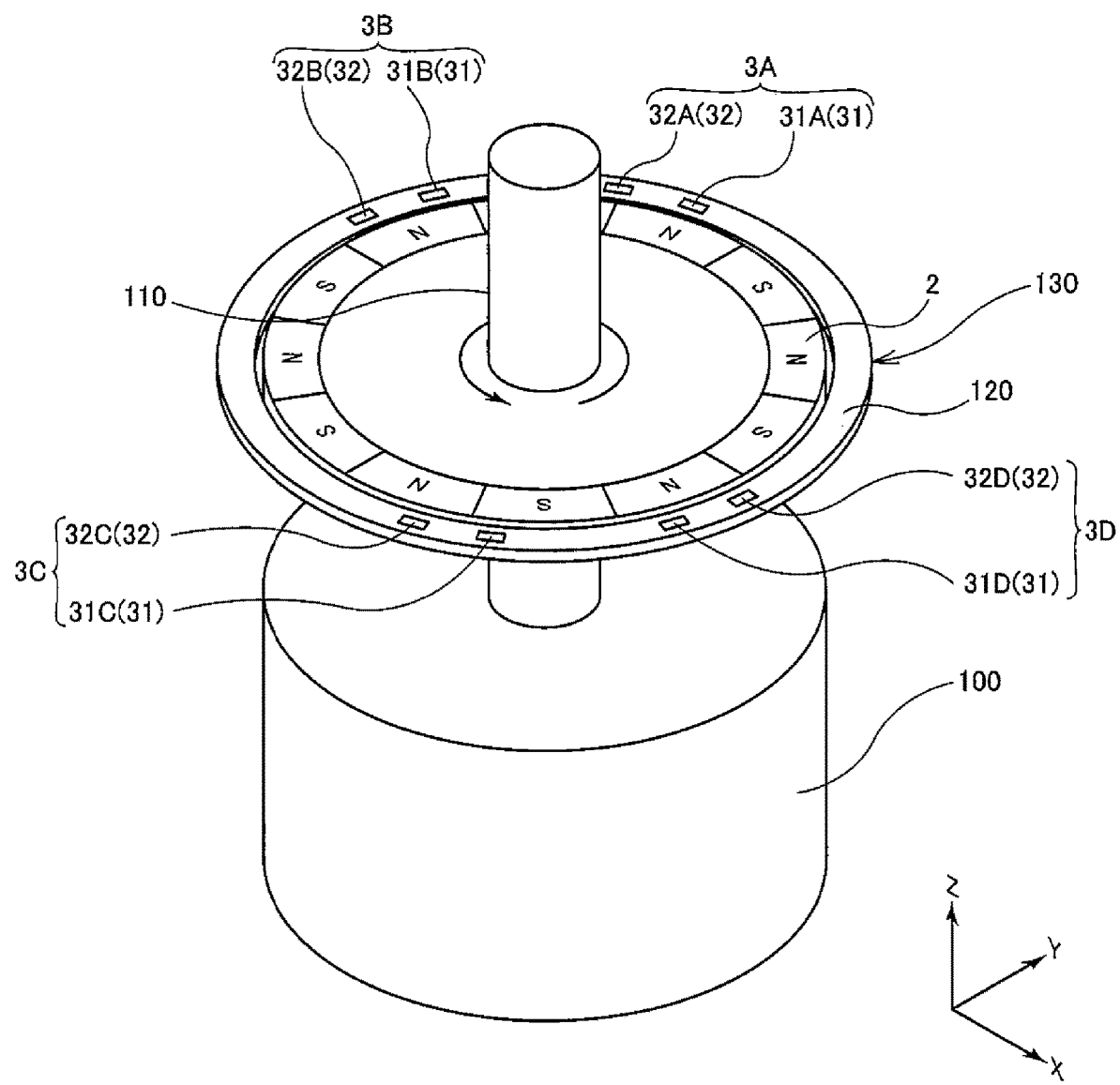
FIG. 7 is a perspective view showing a second step of a procedure for assembling the rotational angle detection device according to the embodiment of the present invention into a motor.
Figure 8:
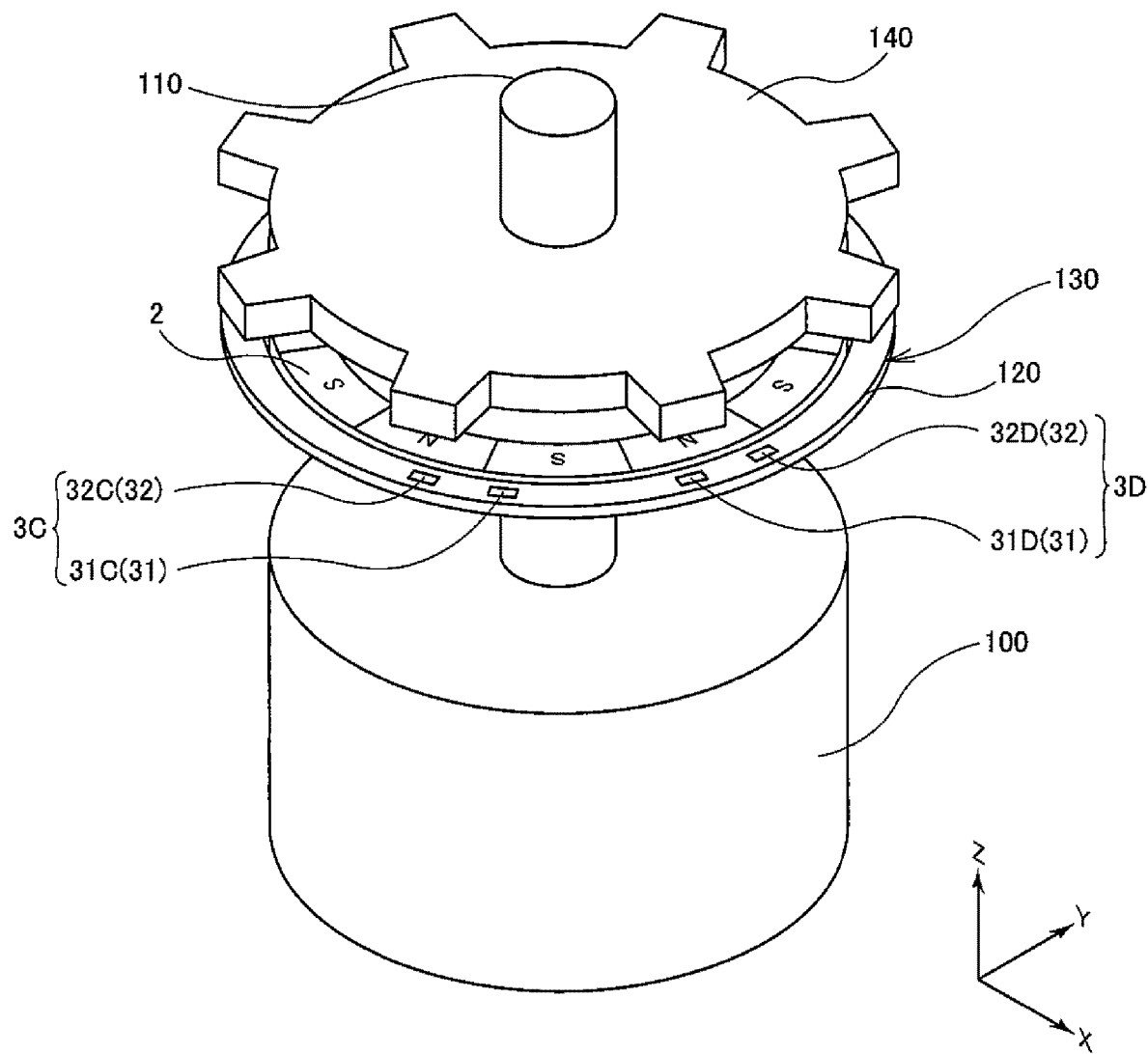
FIG. 8 is a perspective view showing a third step of a procedure for assembling the rotational angle detection device according to the embodiment of the present invention into a motor.
Figure 9:
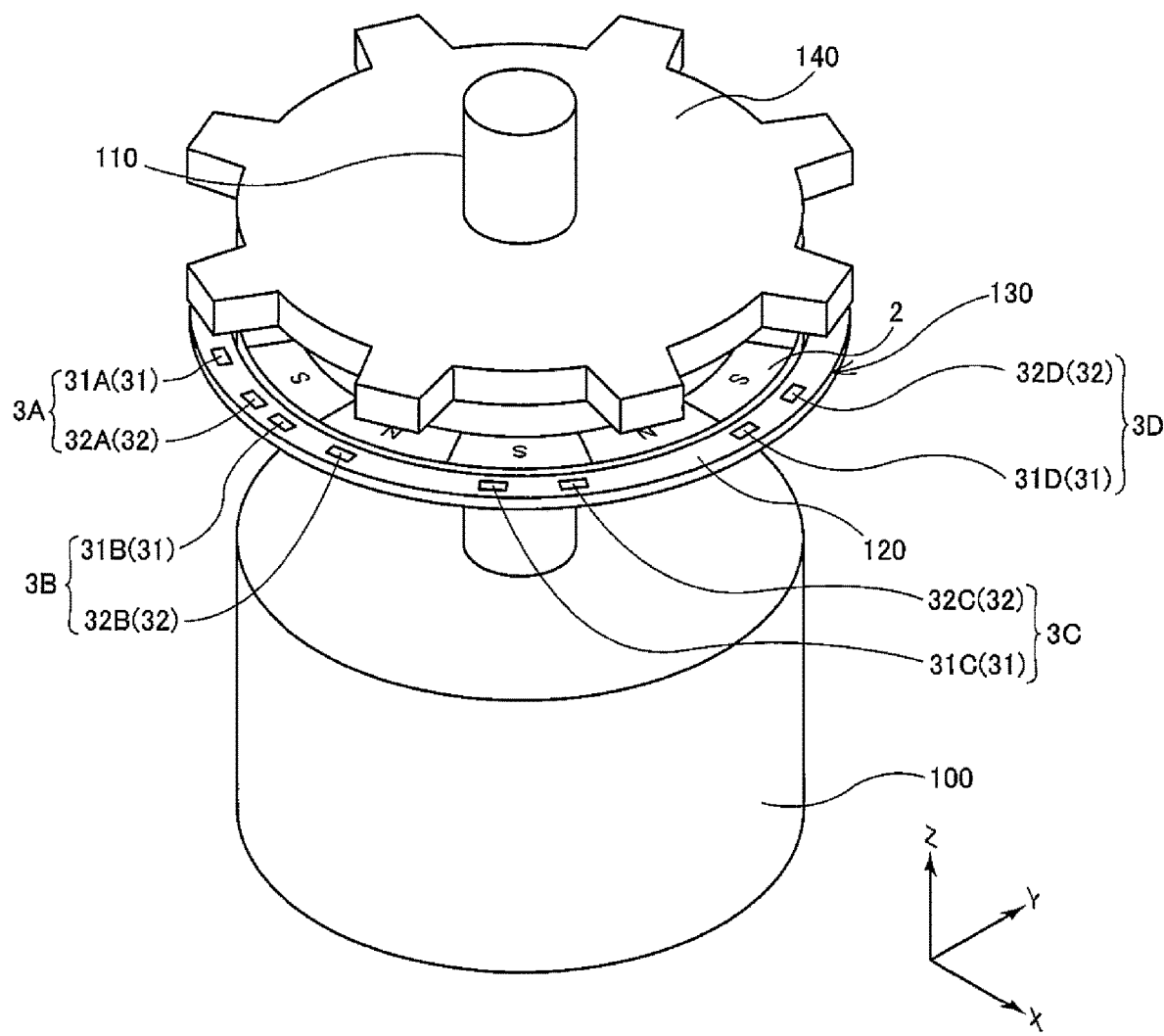
FIG. 9 is a perspective view corresponding to FIG. 8, showing a third step of a procedure for assembling the rotational angle detection device using another aspect of the circuit board on which a first magnetic sensor part and a second magnetic sensor part are mounted into a motor.

For example, when the rotational angle detection device 10 according to this embodiment is provided on the rotational axis of a motor, the multipolar magnet 2 is attached to a shaft 110 of a motor 100 (see FIG. 6), next a sensor module 130 in which the first through fourth magnetic sensor sets 3A~3D are mounted on a circuit board 120 is attached (see FIG. 7), and following this, a gear 140 is attached to the shaft 110 (see FIG. 8). At this time, if the circuit board 120 on which the first through fourth magnetic sensor sets 3A~3D are mounted is roughly circular (see FIG. 8), in the event that the sensor module 130 malfunctions and must be exchanged, the gear 140 must be removed from the shaft 110. On the other hand, if the circuit board 120 on which the first through fourth magnetic sensor sets 3A~3D are mounted is roughly semicircular (see FIG. 9), it is possible to exchange the sensor module 130 (circuit board 120) without removing the gear 140 from the shaft 110 as in the above-described case, so convenience is increased. In addition, when the circuit board 120 is roughly semicircular, it is possible to attach the sensor module 130 after attaching the gear 140 to the shaft 110, which can also increase convenience in the sense that procedures in the manufacturing process for products can be shifted.

In each of the first through fourth magnetic sensor sets 3A~3D, the No. 1-1 through No. 1-4 magnetic sensor parts 31A~31D and the No. 2-1 through No. 2-4 magnetic sensor parts 32A~32D are positioned with an angular spacing of 90/n° centered on the shaft 6 (axis of rotation 5). Through this, for example, the waveform of the second detection signal DS2 output from the No. 2-1 through No. 2-4 magnetic sensor parts 32A~32D has a 90° (electrical angle) phase difference from the waveform of the first detection signal DS1 output from the No. 1-1 through No. 1-4 magnetic sensor sets 31A~31D. That is, if the waveform of the first detection signal DS1 is a sine waveform, the waveform of the second detection signal DS2 is a cosine waveform.

The angular spacing between one group of first magnetic sensor parts and the angular spacing between one group of second magnetic sensor parts that are included in two magnetic sensor sets among the first through fourth magnetic sensor sets 3A~3D may be an angular spacing capable of effectively reducing the error components corresponding to at least third-order harmonic waves. For example, the group of the No. 1-1 magnetic sensor part 31A and the No. 1-2 magnetic sensor part 31B and the group of the No. 2-1 magnetic sensor part 32A and the No. 2-1 magnetic sensor part 32B may each be positioned with an angular spacing capable of effectively reducing the error component corresponding to third-order harmonic waves, and the group of the No. 1-1 magnetic sensor part 31A and the No. 1-3 magnetic sensor part 31C, and the group of the No. 2-1 magnetic sensor part 32A and the No. 2-3 magnetic sensor part 32C may each be positioned with an angular spacing capable of effectively reducing the error component corresponding to third-order harmonic waves.

The angular spacing of the two groups of first magnetic sensor parts and the angular spacing of the two groups of second magnetic sensor parts may each be an angular spacing capable of effectively reducing the error component corresponding to third-order harmonic waves. In this case, the two groups of first magnetic sensor parts and the two groups of second magnetic sensor parts may each be configured by four first magnetic sensor parts and four second magnetic sensor parts, respectively, or may be configured by three first magnetic sensor parts and three second magnetic sensor parts. For example, the group of the No. 1-1 magnetic sensor part 31A and the No. 1-1 magnetic sensor part 31B, the group of the No. 1-3 magnetic sensor part 31C and the No. 1-4 magnetic sensor part 31D, the group of the No. 2-1 magnetic sensor part 32A and the No. 2-2 magnetic sensor part 32B, and the group of the No. 2-3 magnetic sensor part 32C and the No. 2-4 magnetic sensor part 32D may all be positioned with an angular spacing capable of effectively reducing the error component corresponding to third-order harmonic waves. In addition, for example, the group of the No. 1-1 magnetic sensor part 31A and the No. 1-2 magnetic sensor part 31B, the group of the No. 1-1 magnetic sensor part 31A and the No. 1-3 magnetic sensor part 31C, the group of the No. 2-1 magnetic sensor part 32A and the No. 2-2 magnetic sensor part 32B, and the group of the No. 2-1 magnetic sensor part 32A and the No. 2-3 magnetic sensor part 32C may all be positioned with an angular spacing capable of effectively reducing the error component corresponding to third-order harmonic waves.

More preferably, in addition to the above (where the angular spacing of at least one group of first magnetic sensor parts and the angular spacing of at least one group of second magnetic sensor parts are all at an angular spacing capable of effectively reducing the error component corresponding to third-order harmonic waves), the angular spacing of at least one group of first magnetic sensor parts and the angular spacing of at least one group of second magnetic sensor parts may be angular spacing capable of further reducing the error component corresponding to fifth-order harmonic waves. For example, both the group of the No. 1-1 magnetic sensor part 31A and the No. 1-2 magnetic sensor part 31B and the group of the No. 2-1 magnetic sensor part 32A and the No. 2-2 magnetic sensor part 32B may be positioned with an angular spacing capable of effectively reducing the error component corresponding to third-order harmonic waves, and both the group of the No. 1-3 magnetic sensor part 31C and the No. 1-4 magnetic sensor part 31D and the group of the No. 2-3 magnetic sensor part 32C and the No. 2-4 magnetic sensor part 32D may be positioned with an angular spacing capable of effectively reducing the error component corresponding to fifth-order harmonic waves.

The angular spacing capable of reducing the error component corresponding to third-order harmonic waves is 60+360×X° (electrical angle), and the angular spacing capable of reducing the error component corresponding to fifth-order harmonic waves is 36+360×Y° (electrical angle). X and Y are integers of at least 0 and not more than n−1 (where n is the number of pole pairs of the multipolar magnet). The angular spacing in this embodiment capable of reducing the error components corresponding to third-order harmonic waves and fifth-order harmonic waves may be one in which the spacing in the circumferential direction (circumferential direction of the multipolar magnet 2) of two first magnetic sensor parts or two second magnetic sensor parts is expressed by an angle (electrical angle) centered on the shaft 6 (angle of rotation 5), and the angular spacing thereof may be an acute angle or may be an obtuse angle.

The distance AG between the multipolar magnet 2 and the No. 1-1 through No. 1-4 magnetic sensor parts 31A~31D along with the No. 2-1 through No. 2-4 magnetic sensor parts 32A 32D (the distance along the radial direction of the multipolar magnet 2) may be on the order of 10 mm or less, for example, and preferably is on the order of 0.1~6 mm. In general, as this distance AG decreases, the larger the distortion that occurs in the waveforms of the first detection signal DS1 and the second detection signal DS2 output from the No. 1-1 through No. 1-4 magnetic sensor parts 31A~31D and No. 2-1 through No. 2-4 magnetic sensor parts 32A~32D through the error component corresponding to higher-order harmonic waves such as third-order harmonic waves, fifth-order harmonic waves and the like becomes, and the accuracy of the angle of rotation θ declines. This error component corresponding to higher-order harmonic waves becomes large enough that this cannot be ignored, as the above-described distance AG decreases. However, in the rotational angle detection device 10 according to this embodiment, it is possible to effectively reduce the error component corresponding to higher-order harmonic waves included in the first detection signal DS1 and second detection signal DS2 output from the No. 1-1 through No. 1-4 magnetic sensor parts 31A~31D and No. 2-1 through No. 2-4 magnetic sensor parts 32A~32D, so it is possible to calculate the rotational angle θ with high accuracy even when the above-described distance AG is relatively small, and as a result, reducing the size of the rotational angle detection device 10 becomes possible.

The arithmetic processing part 4 has a corrected signal generation part 41 that outputs a first corrected signal AS1 and a second corrected signal AS2 in which the error component included in the first detection signal DS1 and the second detection signal DS2, respectively, has been reduced, an A/D (analog/digital) conversion part 42 that converts the first corrected signal AS1 and the second corrected signal AS2 into digital signals, and a rotational angle detection part 43 that detects the angle of rotation θ of the rotationally moving shaft 6 based on the first corrected signal AS1 and the second corrected signal AS2 that have been converted into digital signals (see FIG. 10).

The first magnetic sensor part (No. 1-1 through No. 1-4 magnetic sensor parts 31A~31D) and the second magnetic sensor part (No. 2-1 through No. 2-4 magnetic sensor parts 32A~32D) each includes at least one magnetic detection element and may include a pair of magnetic detection elements connected in series. In this case, the No. 1-1 through No. 1-4 magnetic sensor parts 31A~31D have a No. 1-1 Wheatstone bridge circuit 311 and a No. 1-2 Wheatstone bridge circuit 312 that include a first magnetic detection element pair and a second magnetic detection element pair connected in series, and the No. 2-1 through No. 2-4 magnetic sensor parts 32A~32D have a No. 2-1 Wheatstone bridge circuit 321 and a No. 2-2 Wheatstone bridge circuit 322 that include a first magnetic detection element pair and a second magnetic detection element pair connected in series. In place of the No. 1-1 Wheatstone bridge circuit 311, the No. 1-2 Wheatstone bridge circuit 312, the No. 2-1 Wheatstone bridge circuit 321 and the No. 2-2 Wheatstone bridge circuit 322, respectively, the No. 1-1 through No. 1-4 magnetic sensor parts 31A~31D and No. 2-1 through No. 2-4 magnetic sensor parts 32A~32D may have half-bridge circuits that contain only a first magnetic detection element pair and do not contain a second magnetic detection element pair.

Figure 11:
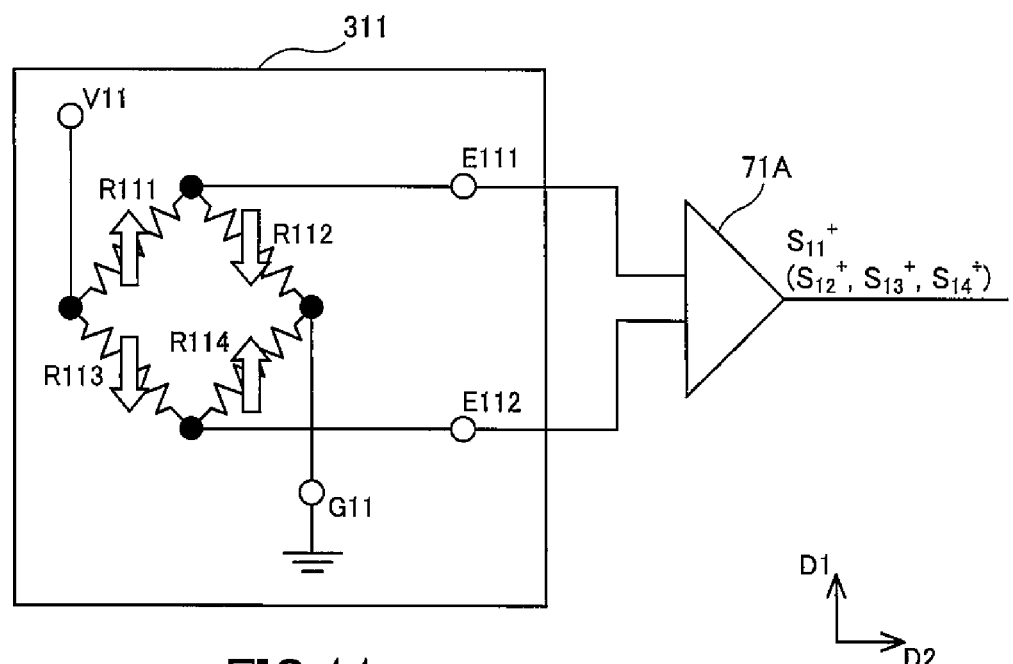
FIG. 11 is a circuit diagram schematically showing the circuit configuration of a No. 1-1 Wheatstone bridge circuit in the embodiment of the present invention.

As shown in FIG. 11, the No. 1-1 Wheatstone bridge circuit 311 possessed by the No. 1-1 through No. 1-4 magnetic sensor parts 31A~31D includes a power source port V11, a ground port G11, two output ports E111 and E112, a first pair of magnetic detection elements R111 and R112 connected in series, and a second pair of magnetic detection elements R113 and R114 connected in series. One end of each of the magnetic resistance elements R111 and R113 is connected to the power source port V11. The other end of the magnetic detection element R111 is connected to one end of the magnetic detection element R112 and the output port E111. The other end of the magnetic detection element R113 is connected to one end of the magnetic detection element R114 and the output port E112. The other end of each of the magnetic detection elements R112 and R114 is connected to the ground port G11. A power source voltage of a predetermined magnitude is applied on the power source port V11, and the ground port G11 is connected to ground.

Figure 12:
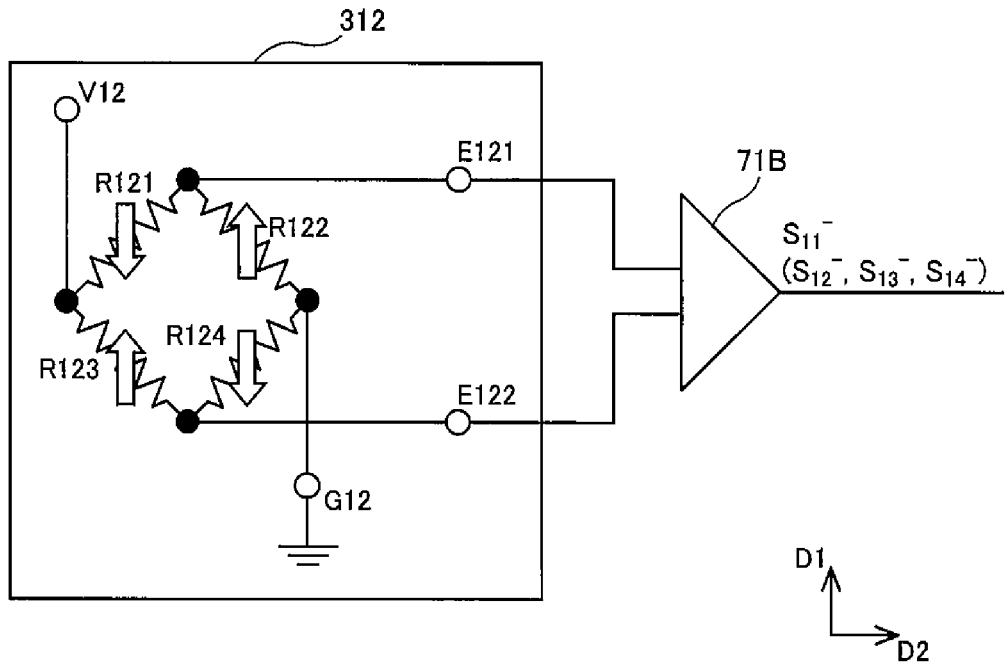
FIG. 12 is a circuit diagram schematically showing the circuit configuration of a No. 1-2 Wheatstone bridge circuit in the embodiment of the present invention.

As shown in FIG. 12, the No. 1-2 Wheatstone bridge circuit 312 possessed by the No. 1-1 through No. 1-4 magnetic sensor parts 31A~31D has the same configuration as the No. 1-1 Wheatstone bridge circuit 311 and includes a power source port V12, a ground port G12, two output ports E121 and E122, a first pair of magnetic detection elements R121 and R122 connected in series, and a second pair of magnetic detection elements R123 and R124 connected in series. One end of each of the magnetic resistance elements R121 and R123 is connected to the power source port V12. The other end of the magnetic detection element R121 is connected to one end of the magnetic detection element R122 and the output port E121. The other end of the magnetic detection element R123 is connected to one end of the magnetic detection element R124 and the output port E122. The other end of the magnetic detection elements R122 and R124 is connected to the ground port G12, respectively. A power source voltage of a predetermined magnitude is applied on the power source port V12, and the ground port G12 is connected to ground.

Figure 13:
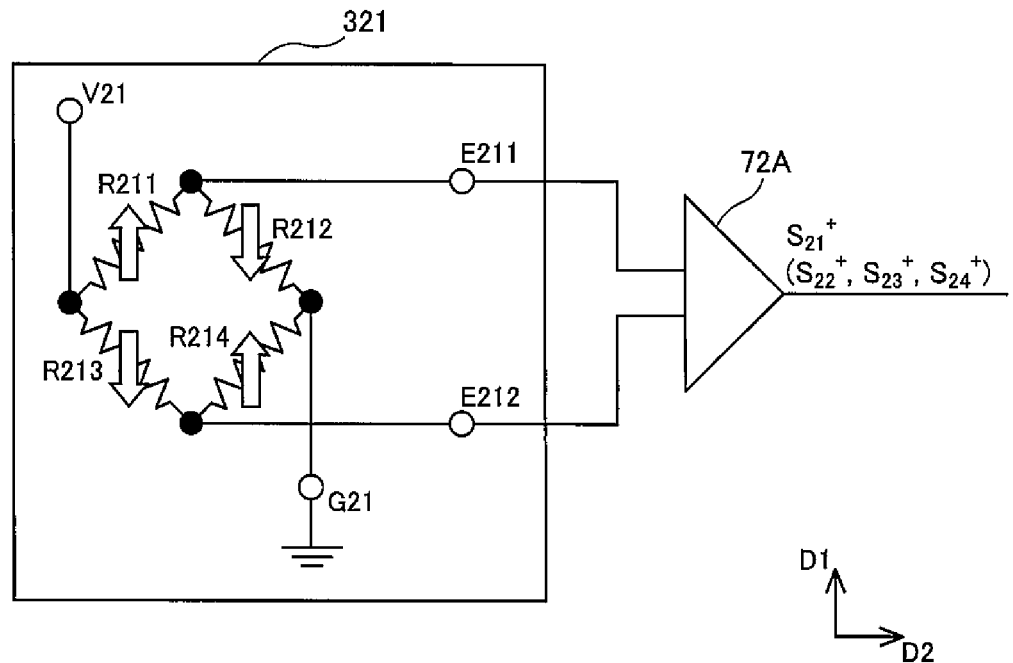
FIG. 13 is a circuit diagram schematically showing the circuit configuration of a No. 2-1 Wheatstone bridge circuit in the embodiment of the present invention.

As shown in FIG. 13, the No. 2-1 Wheatstone bridge circuit 321 possessed by the No. 2-1 through No. 2-4 magnetic sensor parts 32A~32D has the same configuration as the No. 1-1 Wheatstone bridge circuit 311 and includes a power source port V21, a ground port G21, two output ports E211 and E212, a first pair of magnetic detection elements R211 and R212 connected in series, and a second pair of magnetic detection elements R213 and R214 connected in series. One end of each of the magnetic resistance elements R211 and R213 is connected to the power source port V21. The other end of the magnetic detection element R211 is connected to one end of the magnetic detection element R212 and the output port E211. The other end of the magnetic detection element R213 is connected to one end of the magnetic detection element R214 and the output port E212. The other end of the magnetic detection elements R212 and R214 is connected to the ground port G21, respectively. A power source voltage of a predetermined magnitude is applied on the power source port V21, and the ground port G21 is connected to ground.

Figure 14:
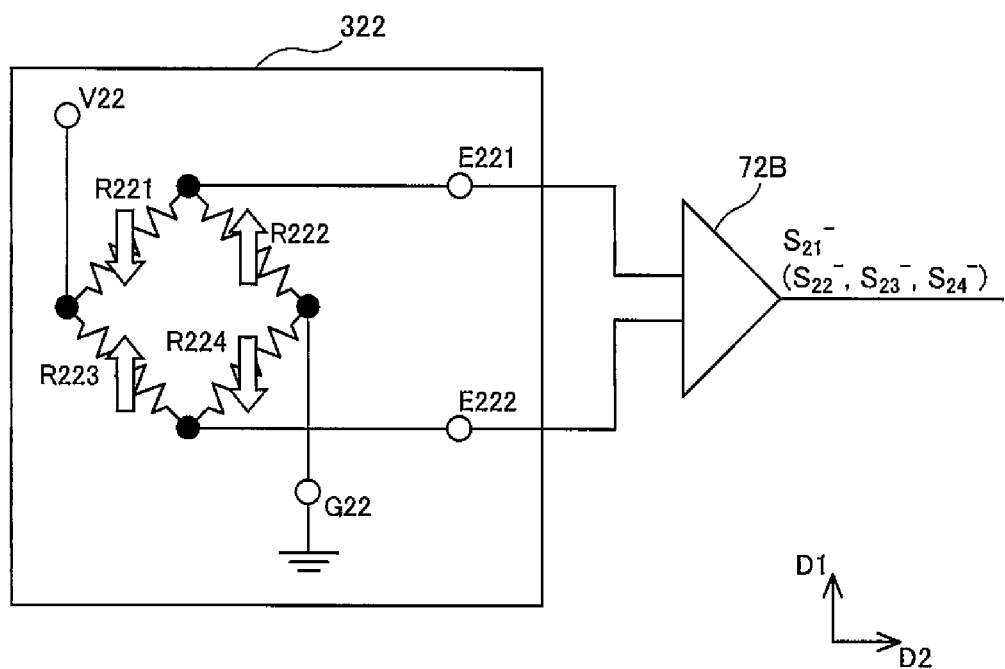
FIG. 14 is a circuit diagram schematically showing the circuit configuration of a No. 2-2 Wheatstone bridge circuit in the embodiment of the present invention.

As shown in FIG. 14, the No. 2-2 Wheatstone bridge circuit 322 possessed by the No. 2-1 through No. 2-4 magnetic sensor parts 32A~32D has the same configuration as the No. 2-1 Wheatstone bridge circuit 321 and includes a power source port V22, a ground port G22, two output ports E221 and E222, a first pair of magnetic detection elements R221 and R222 connected in series, and a second pair of magnetic detection elements R223 and R224 connected in series. One end of each of the magnetic resistance elements R221 and R223 is connected to the power source port V22. The other end of the magnetic detection element R221 is connected to one end of the magnetic detection element R222 and the output port E221. The other end of the magnetic detection element R223 is connected to one end of the magnetic detection element R224 and the output port E222. The other end of the magnetic detection elements R222 and R224 is connected to the ground port G22, respectively. A power source voltage of a predetermined magnitude is applied on the power source port V22, and the ground port G22 is connected to ground.

In this embodiment, it is possible to use an MR element such as a TMR element, a GMR element, an AMR element or the like, or a magnetic detection element such as a Hall's element or the like, as all of the magnetic detection elements R111~R124 and R211~R224 included in the No. 1-1 Wheatstone bridge circuit 311, the No. 1-2 Wheatstone bridge circuits 312, the No. 2-1 Wheatstone bridge circuit 321 and the No. 2-2 Wheatstone bridge circuit 322, and using TMR element is particularly preferable. A TMR element or a GMR element has a magnetization fixed layer in which the magnetization direction is fixed, a free layer in which the magnetization direction changes in accordance with the direction of the applied magnetic field, and a nonmagnetic layer positioned between the magnetization fixed layer and the free layer.

Figure 15:
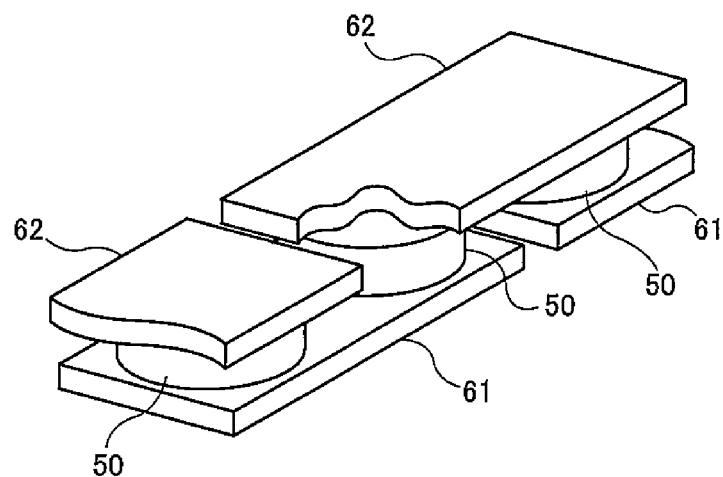
FIG. 15 is a perspective view showing the schematic configuration of an MR element as a magnetic detection element in the embodiment of the present invention.
Figure 16:
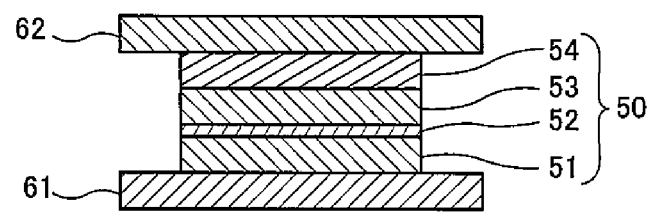
FIG. 16 is a cross-sectional view showing the schematic configuration of an MR element as a magnetic detection element in the embodiment of the present invention.

Specifically, as shown in FIG. 15, the MR element has a plurality of lower electrodes 61, a plurality of MR films 50 and a plurality of upper electrodes 62. The plurality of lower electrodes 61 is provided on a substrate (undepicted). Each of the lower electrodes 61 has a long, slender shape. A gap is formed between two lower electrodes 61 adjacent in the lengthwise direction of the lower electrodes 61. MR films 50 are provided near both ends in the lengthwise direction on the top surface of each of the lower electrodes 61. As shown in FIG. 16, the MR film 50 has a roughly circular shape in a plan view and includes a free layer 51, a nonmagnetic layer 52, a magnetization fixed layer 53 and an antiferromagnetic layer 54, layered in that order from the lower electrode 61 side. The free layer 51 is electrically connected to the lower electrode 61. The antiferromagnetic layer 54 is configured by an antiferromagnetic material and serves the role of fixing the direction of magnetization of the magnetization fixed layer 53 by causing exchange coupling with the magnetization fixed layer 53. The plurality of upper electrodes 62 is provided on top of the plurality of MR films 50. Each of the upper electrodes 62 has a long, slender shape, is positioned on two of the lower electrodes 61 adjacent in the lengthwise direction of the lower electrodes 61, and electrically connects the antiferromagnetic layers 54 of two adjacent MR films 50. The MR film 50 may have a configuration in which the free layer 51, the nonmagnetic layer 52, the magnetization fixed layer 53 and the antiferromagnetic layer 54 are layered in that order from the upper electrode 62 side. In addition, the antiferromagnetic layer 54 may be omitted by making the magnetization fixed layer 53 a so-called self-pinned fixed layer (Synthetic Ferri Pinned layer, or SFP layer) with a layered fern structure of a ferromagnetic layer/nonmagnetic intermediate layer/ferromagnetic layer with the two ferromagnetic layers caused to couple antiferromagnetically.

In a TMR element, the nonmagnetic layer 52 is a tunnel barrier layer. In a GMR element, the nonmagnetic layer 52 is a nonmagnetic electroconductive layer. In a TMR element or GMR element, the resistance value changes in accordance with the angle formed by the direction of magnetization of the free layer 51 with respect to the direction of magnetization of the magnetization fixed layer 53, and the resistance value is a minimum when this angle is 0° (when the magnetization directions are parallel to each other) and the resistance value is a maximum when this angle is 180° (when the magnetization directions are antiparallel to each other).

In FIGS. 11~14, when the magnetic detection elements R111~R124 and R211~R224 are TMR elements or GMR elements, the magnetization directions of the magnetization fixed layers 53 thereof are indicated by white arrows. In the No. 1-1 Wheatstone bridge circuit 311 of the No. 1-1 through No. 1-4 magnetic sensor parts 31A~31D, the magnetization directions of the magnetization fixed layers 53 of the magnetic detection elements R111~R114 are parallel to a first direction D1, and the magnetization directions of the magnetization layers 53 of the magnetic detection elements R111 and R114 and the magnetization directions of the magnetization fixed layers 53 of the magnetic detection elements R112 and R113, are antiparallel directions to each other. In the No. 1-2 Wheatstone bridge circuit 312, the magnetization directions of the magnetization fixed layers 53 of the magnetic detection elements R121~R124 are parallel to the first direction D1, and the magnetization directions of the magnetization layers 53 of the magnetic detection elements R121 and R124 and the magnetization directions of the magnetization fixed layers 53 of the magnetic detection elements R122 and R123, are antiparallel directions to each other. The magnetization direction of the magnetization fixed layer 53 of each of the magnetic detection elements R111~R114 in the No. 1-1 Wheatstone bridge circuit 311 and the magnetization direction of the magnetization fixed layer 53 of each of the magnetic detection elements R121~R124 in the No. 1-2 Wheatstone bridge circuit 312 are antiparallel directions to each other.

In the No. 2-1 Wheatstone bridge circuit 321 of the No. 2-1 through No. 2-4 magnetic sensor parts 32A~32D, the magnetization directions of the magnetization fixed layers 53 of the magnetic detection elements R211~R214 are parallel to the first direction D1, and the magnetization directions of the magnetization layers 53 of the magnetic detection elements R212 and R214 and the magnetization directions of the magnetization fixed layers 53 of the magnetic detection elements R212 and R213, are antiparallel directions to each other. In the No. 2-2 Wheatstone bridge circuit 322, the magnetization directions of the magnetization fixed layers 53 of the magnetic detection elements R221~R224 are parallel to the first direction D1, and the magnetization directions of the magnetization layers 53 of the magnetic detection elements R222 and R224 and the magnetization directions of the magnetization fixed layers 53 of the magnetic detection elements R222 and R223, are antiparallel directions to each other. The magnetization direction of the magnetization fixed layer 53 of each of the magnetic detection elements R211~R214 in the No. 2-1 Wheatstone bridge circuit 321 and the magnetization direction of the magnetization fixed layer 53 of each of the magnetic detection elements R221~R224 in the No. 2-2 Wheatstone bridge circuit 322 are antiparallel directions to each other.

In the No. 1-1 through No. 1-4 magnetic sensor parts 31A~31D and the No. 2-1 through No. 2-4 magnetic sensor parts 32A~32D, the electric potential difference of the output ports E111, E112, E121 and E122 and the output ports E211, E212, E221 and E222 changes in accordance with the change in the direction of the magnetic field accompanying rotational movement of the shaft 6, and the sensor signals S11+~S14+, S11−~S14−, S21+~S24+ and S21−~S24− are output as signals indicating the magnetic field strength.

A No. 1-1 differential detector 71A outputs signals corresponding to the electric potential difference of the output ports E111 and E112 to the corrected signal generation part 41 as the sensor signals S11+~S14+. A No. 1-2 differential detector 71B outputs signals corresponding to the electric potential difference of the output ports E121 and E122 to the corrected signal generation part 41 as the sensor signals S11−~S14−. A No. 2-1 differential detector 72A outputs signals corresponding to the electric potential difference of the output ports E211 and E212 to the corrected signal generation part 41 as the sensor signals S21+~S24+. A No. 2-2 differential detector 72B outputs signals corresponding to the electric potential difference of the output ports E221 and E222 to the corrected signal generation part 41 as the sensor signals S21−~S24−.

In the No. 1-1 through No. 1-4 magnetic sensor parts 31A~31D, each of the magnetization directions of the magnetization fixed layers 53 of the magnetic detection elements R111~R114 in the No. 1-1 Wheatstone bridge circuit 311 and each of the magnetization directions of the magnetization fixed layers 53 of the magnetic detection elements R121~R124 in the No. 1-2 Wheatstone bridge circuit 312 are antiparallel to each other. In this case, the waveforms of the sensor signals S11+~S14+ and the sensor signals S11−~S14− are each sine waveforms dependent on the rotational angle θ of the multipolar magnet 2, and are waveforms having a phase difference of 180/n° from each other.

In the No. 2-1 through No. 2-4 magnetic sensor parts 32A~32D, each of the magnetization directions of the magnetization fixed layers 53 of the magnetic detection elements R211~R214 in the No. 2-1 Wheatstone bridge circuit 321 and each of the magnetization directions of the magnetization fixed layers 53 of the magnetic detection elements R221~R224 in the No. 2-2 Wheatstone bridge circuit 322 are antiparallel to each other. Furthermore, each of the No. 2-1 through No. 2-4 magnetic sensor parts 32A~32D in the second magnetic sensor part is positioned with an angular spacing of 90/n° about the shaft 6 (axis of rotation 5) with respect to each of the No. 1-1 through No. 1-4 magnetic sensor parts 31A~31D of the first magnetic sensor part. In this case, the waveforms of the sensor signals S21+~S24+ and the sensor signals S21−~S24− are each cosine waveforms dependent on the rotational angle θ of the multipolar magnet 2, and are waveforms having a phase difference of 180/n° from each other.

The corrected signal generation part 41 generates a sine signal (sin θ1+) through addition processing of the sensor signals S11+, S12+, S13+ and S14+ output from the No. 1-1 through No. 1-4 magnetic sensor parts 31A~31D, respectively, and generates a sine signal (sin θ1−) through addition processing of the sensor signals S11−, S12−, S13− and S14− output from the No. 1-1 through No. 1-4 magnetic sensor parts 31A~31D, respectively.

In addition, the corrected signal generation part 41 generates a cosine signal (cos θ1+) through addition processing of the sensor signals S21+, S22+, S23+ and S24+ output from the No. 2-1 through No. 2-4 magnetic sensor parts 32A~32D, respectively, and generates a cosine signal (cos θ1−) through addition processing of the sensor signals S21−, S22−, S23− and S24− output from the No. 2-1 through No. 2-4 magnetic sensor parts 32A~32D, respectively.

The ideal component having the ideal sine waveform and error components composed of higher-order harmonic waves such as third-order harmonic waves, fifth-order harmonic waves and the like are included in the sensor signals S11+~S14+ and S11−~S14− output from the No. 1-1 through No. 1-4 magnetic sensor parts 31A~31D, respectively. Similarly, the above-described ideal component and the above-described error components are also included in the sensor signals S21+~S24+ and S21−~S24− output from the No. 2-1 through No. 2-4 magnetic sensor parts 32A~32D, respectively. In this embodiment, at least two groups of magnetic sensor sets are positioned in mutually different regions among the first through sixth regions AR1~AR6 at the perimeter of the multipolar magnet 2, and through this, sine signals (sin θ+, sin θ−) and cosine signals (cos θ+, cos θ−) with the above-described error components reduced are generated by addition processing by the corrected signal generation part 41. Furthermore, by respectively calculating the difference of the sine signals (sin θ+, sin θ−) generated by the corrected signal generation part 41 and the difference of the cosine signals (cos θ+, cos θ−), the first corrected signal AS1 and the second corrected signal AS2 are generated. The first corrected signal AS1 has a waveform extremely close to the ideal sine waveform (sine waveform) in which the error components corresponding to third-order harmonic waves and fifth-order harmonic waves and the like are reduced, and the second corrected signal AS2 has a waveform extremely close to the ideal cosine waveform (cosine waveform) in which the error components corresponding to third-order harmonic waves and fifth-order harmonic waves and the like are reduced.

The A/D conversion part 42 converts the first corrected signal AS1 and the second corrected signal AS2 (analog signals related to the angle of rotation θ) output from the corrected signal generation part 41 into the digital signals S1 and S2, respectively, and the digital signals S1 and S2 are input into the rotational angle detection part 43.

The rotational angle detection part 43 accomplishes arithmetic processing based on the first corrected signal AS1 (S1) and second corrected signal AS2 (S2) converted into digital signals by the A/D conversion part 42 and calculates the angle of rotation θ of the shaft 6. The angle of rotation θ of the shaft 6 calculated by the rotational angle detection part 43 is stored in a memory part (undepicted) included in the arithmetic processing part 4. The arithmetic processing part 4 (the corrected signal generation part 41 and the rotational angle detection part 43) is configured by a microcomputer, an Application Specific Integrated Circuit (ASIC) or the like. The angle of rotation θ of the shaft 6 can be calculated through the arctangent calculation shown in the equation below, for example.

$$\theta = a\tan(S1/S2)$$

Within a 360° range, there are two solutions to the angle of rotation θ in the above-described equation, differing by 180°. However, through the combination of positive/negative of the first corrected signal AS1 and the second corrected signal AS2, it is possible to determine which of the two solutions to the above-described equation is the true value of the angle of rotation θ. That is, when the first corrected signal AS1 has a positive value, the angle of rotation θ is larger than 0° and smaller than 180°. When the first corrected signal AS1 has a negative value, the angle of rotation θ is larger than 180° and smaller than 360°. When the second corrected signal AS2 has a positive value, the angle of rotation θ is within the range of at least 0° and less than 90° and larger than 270° but 360° or smaller. When the second corrected signal AS2 has a negative value, the angle of rotation θ is larger than 90° and smaller than 270°. The rotational angle detection part 43 calculates the angle of rotation θ within a 360° range through the above-described equation and a determination of the combination of positive/negative of the first corrected signal AS1 and the second corrected signal AS2. The first corrected signal AS1 and second corrected signal AS2 used for calculating the angle of rotation θ are generated by reducing the error components from the sensor signals S11+~S14+ and S11−~S14− output from the No. 1-1 through No. 1-4 magnetic sensor parts 31A~31D, respectively, and the sensor signals S21+~S24+ and 21−~S24− output from the No. 2-1 through No. 2-4 magnetic sensor parts 32A~32D, respectively, as described above. Consequently, the angle of rotation θ can be calculated with high accuracy based on the first corrected signal AS1 and the second corrected signal AS2.

As described above, with the rotational angle detection device 10 according to this embodiment, it is possible to calculate the angle of rotation θ with high accuracy, so high-accuracy control using this angle of rotation θ becomes possible in the application to which this rotational angel detection device 10 is applied.

The embodiment described above was described in order to facilitate understanding of the present invention, and it is not intended to limit the present invention. Accordingly, all elements disclosed in the above-described embodiment shall be construed to include all design modifications and equivalents falling within the technical scope of the present invention.

Figure 17:
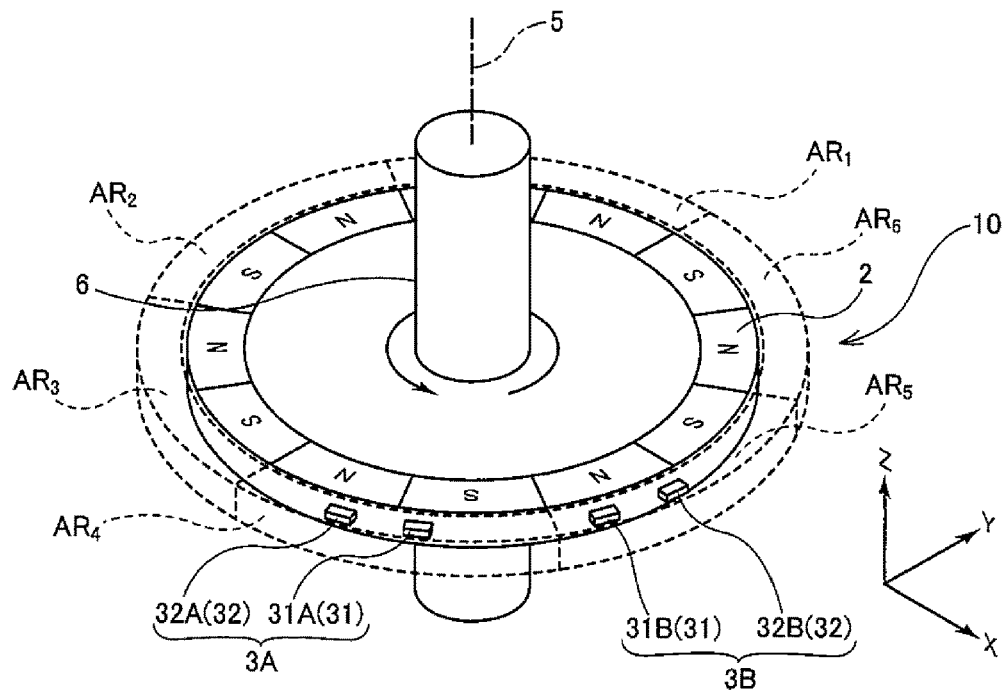
FIG. 17 is a perspective view showing the schematic configuration of another aspect of the rotational angle detection device according to the embodiment of the present invention.

In the above-described embodiment, the explanation took as an example a rotational angle detection device 10 provided with the four groups of magnetic sensor sets of first through fourth magnetic sensor sets 3A~3D, but it is not limited to this aspect. For example, the number of groups of magnetic sensor sets may be provided with 2(m−1)/2 groups of magnetic sensor sets in order to reduce the error component corresponding to m-order harmonic waves (where m is an integer that is at least 3). In order to reduce the error component corresponding to at least third-order harmonic waves, as shown in FIG. 17, two groups of magnetic sensor sets should be provided, namely the first magnetic sensor set 3A that includes the No. 1-1 magnetic sensor part 31A and the No. 2-1 magnetic sensor part 32A, and the second magnetic sensor set 3B that includes the No. 1-2 magnetic sensor part 31B and the No. 2-2 magnetic sensor part 32B. In this case, the first magnetic sensor set 3A and the second magnetic sensor set 3B should be positioned in mutually different regions (the fourth region AR4 and the fifth region AR5 in FIG. 17) among the first though nth regions AR1~ARn (n=6 in FIG. 17). For example, these may be positioned in regions (the fourth region AR4 and the fifth region AR5 as shown in FIG. 17) adjacent to each other in the circumferential direction of the multipolar magnet 2, may be positioned in regions (for example, the fourth region AR4 and the sixth region AR6, or the like) that differ from each other so that one region is interposed in between in the circumferential direction of the multipolar magnet 2, or may be positioned in regions (for example, the first region AR1 and the fourth region AR4) that are opposite to each other in the radial direction of the multipolar magnet 2.

Figure 18:
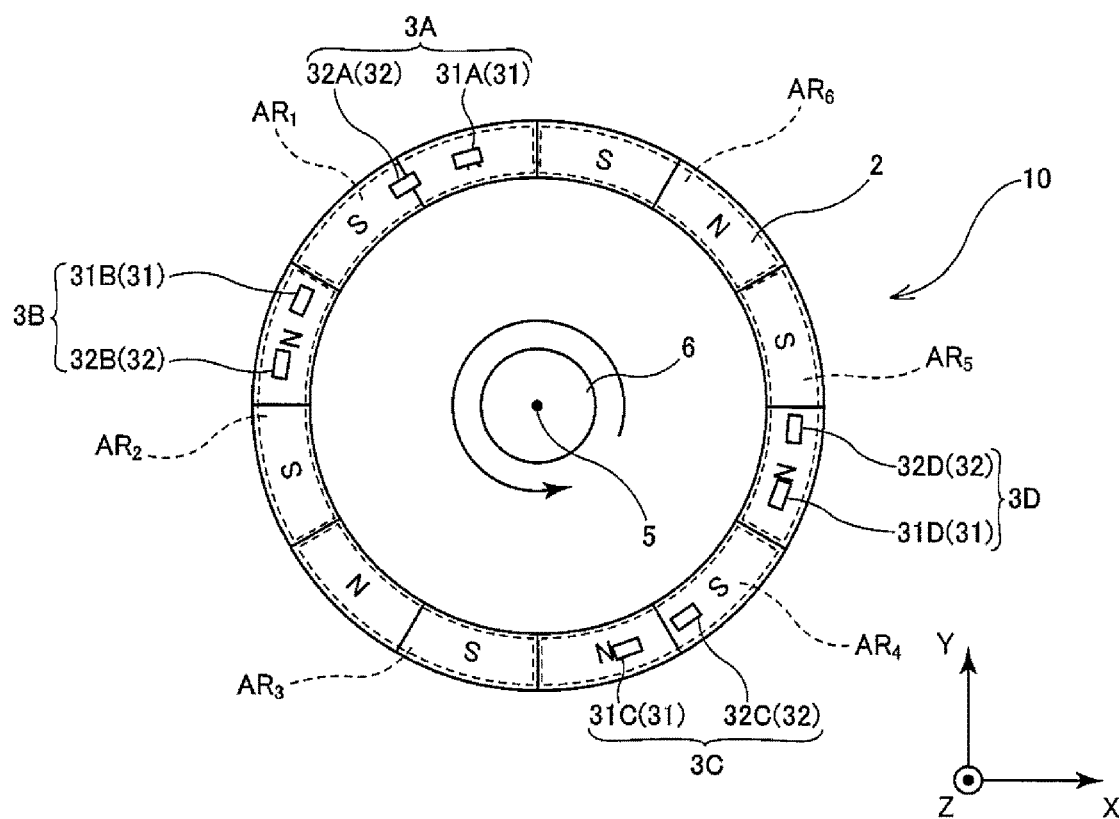
FIG. 18 is a top view showing the schematic configuration of another aspect of the magnetic detection device according to the embodiment of the present invention.

In the above-described embodiment, the description took as an example a configuration in which the first through fourth magnetic sensor sets 3A~3D are positioned in any of the first through nth regions AR1~ARn positioned so as to surround the multipolar magnet 2 at the outside of the multipolar magnet in the radial direction, but it is not limited to this aspect. For example, the first through fourth magnetic sensor sets 3A~3D may be positioned in any of the first through sixth regions AR1~AR6 positioned above (to one side) of the multipolar magnet 2 along the axial direction of the axis of rotation 5 (see FIG. 18), or may be positioned in any of the first through sixth regions AR1~AR6 positioned below (the other side) of the multipolar magnet 2. That is, the first through nth regions AR1~ARn may be established above or below the multipolar magnet 2, or to the outside in the radial direction. In the aspect shown in FIG. 18, the gap between the multipolar magnet 2 and the No. 1-1 through No. 1-4 magnetic sensor parts 31A~31D and the No. 2-1 through No. 2-4 magnetic sensor parts 32A~32D (the distance in the axial direction of the axis of rotation 5) should be on the order of 10 mm or less, for example, and preferably should be on the order of 0.1-6 mm.

EMBODIMENT(S)

Below, the present invention will be described in further detail using embodiments and the like, but the present invention is not limited in any way by the below-described embodiments and the like.

Embodiment 1

In the rotational angle detection device 10 having the configuration shown in FIG. 1 and FIG. 2, the angular detection error AE was found through simulations for Samples 1~10 in which the positioning of the first magnetic sensor part (No. 1-1 through No. 1-4 magnetic sensor parts 31A~31D) and the second magnetic sensor part (No. 2-1 through No. 2-4 magnetic sensor parts 32A~32D) of the first through fourth magnetic sensor sets 3A~3D was caused to variously fluctuate. In Samples 1~10, the first through fourth magnetic sensor sets 3A~3D were positioned in each of four regions arbitrarily selected from among the first through sixth regions AR1~AR6. For comparison, the angular detection error AE was similarly found through simulations for a sample (Sample ref) in which the No. 1-1 magnetic sensor part 31A of the first magnetic sensor set 3A was placed at the position of 0° (electrical angle), the No. 1-2 magnetic sensor part 31B of the second magnetic sensor set 3B was placed at the position of 36° (electrical angle), the No. 1-3 magnetic sensor part 31C of the third magnetic sensor set 3C was placed at the position of 60° (electrical angle), and the No. 1-4 magnetic sensor part 31D of the fourth magnetic sensor set 3D was placed at the position of 96° (electrical angle). In each sample, the No. 2-1 through No. 2-4 magnetic sensor parts 32A~32D were positioned having a phase difference of 90° (electrical angle) from the No. 1-1 through No. 1-4 magnetic sensor parts 31A~31D in each magnetic sensor set. Positioning of the No. 1-1 through No. 1-4 magnetic sensor parts 31A~31D and simulation results for the angular detection error AE are shown in Table 1. In Table 1, the positions of the No. 1-1 through No. 1-4 magnetic sensor parts 31A~31D are expressed as numerical values of the electrical angle when the boundary between the first region AR1 and the sixth region AR6 is taken as 0° in the rotational angle detection device 10 shown in FIG. 1 and FIG. 2, and the first region AR1 is a region in the angular range of at least 0° and less than 360° (electrical angle), the second region AR2 is a region in the angular range of at least 360° and less than 720° (electrical angle), the third region AR3 is a region in the angular range of at least 720° and less than 1080° (electrical angle), the fourth region AR4 is a region in the angular range of at least 1080° and less than 1440° (electrical angle), the fifth region AR5 is a region in the angular range of at least 1440° and less than 1800° (electrical angle), and the sixth region AR6 is a region in the angular range of at least 1800° and less than 2160° (electrical angle).

TABLE 1

| | Positioning of first magnetic sensor part (electrical angle) | | | | |
|---|---|---|---|---|---|
| | No. 1-1 | No. 1-2 | No. 1-3 | No. 1-4 | AE |
| Sample 1 | 36 | 720 | 1140 | 1896 | 0.450 |
| Sample 2 | 36 | 456 | 1140 | 1440 | 0.457 |
| Sample 3 | 60 | 456 | 1080 | 1476 | 0.476 |

TABLE 1-continued

| | Positioning of first magnetic sensor part (electrical angle) | | | | |
|---|---|---|---|---|---|
| | No. 1-1 | No. 1-2 | No. 1-3 | No. 1-4 | AE |
| Sample 4 | 36 | 456 | 1080 | 1500 | 0.477 |
| Sample 5 | 396 | 1080 | 1500 | 1896 | 0.491 |
| Sample 6 | 60 | 756 | 1176 | 1800 | 0.494 |
| Sample 7 | 360 | 756 | 1500 | 1896 | 0.497 |
| Sample 8 | 60 | 456 | 1116 | 1800 | 0.498 |
| Sample 9 | 0 | 420 | 816 | 1476 | 0.509 |
| Sample 10 | 60 | 720 | 1176 | 1476 | 0.509 |
| Sample ref. | 0 | 36 | 60 | 96 | 1.521 |

Embodiment 2

Except that two arbitrarily selected magnetic sensor sets are positioned in the same region, the angular detection error AE was found in the same way as in embodiment 1 through simulations for Samples 11~17 in which the positioning of the No. 1-1 through No. 1-4 magnetic sensor parts 31A~31D and the No. 2-1 through No. 2-4 magnetic sensor parts 32A~32D of the first through fourth magnetic sensor sets 3A~3D was caused to variously fluctuate. Positioning of the No. 1-1 through No. 1-4 magnetic sensor parts 31A~31D and simulation results for the angular detection error AE are shown in Table 2. In Table 2, the positions of the No. 1-1 through No. 1-4 magnetic sensor parts 31A~31D are expressed as numerical values of the electrical angle when the boundary between the first region AR1 and the sixth region AR6 is taken as 0° in the rotational angle detection device 10 shown in FIG. 1 and FIG. 2, and the first region AR1 is a region in the angular range of at least 0° and less than 360° (electrical angle), the second region AR2 is a region in the angular range of at least 360° and less than 720° (electrical angle), the third region AR3 is a region in the angular range of at least 720° and less than 1080° (electrical angle), the fourth region AR4 is a region in the angular range of at least 1080° and less than 1440° (electrical angle), the fifth region AR5 is a region in the angular range of at least 1440° and less than 1800° (electrical angle), and the sixth region AR6 is a region in the angular range of at least 1800° and less than 2160° (electrical angle).

TABLE 2

| | Positioning of first magnetic sensor part (electrical angle) | | | | |
|---|---|---|---|---|---|
| | No. 1-1 | No. 1-2 | No. 1-3 | No. 1-4 | AE |
| Sample 11 | 360 | 456 | 1140 | 1836 | 0.519 |
| Sample 12 | 720 | 756 | 1176 | 1500 | 0.646 |
| Sample 13 | 0 | 96 | 1476 | 1860 | 0.748 |
| Sample 14 | 0 | 780 | 1440 | 1500 | 0.748 |
| Sample 15 | 756 | 816 | 1116 | 1536 | 0.932 |
| Sample 16 | 0 | 36 | 420 | 1176 | 0.955 |
| Sample 17 | 60 | 360 | 396 | 1896 | 1.006 |
| Sample ref. | 0 | 36 | 60 | 96 | 1.521 |

Embodiment 3

Except for using a multipolar magnet 2 having eight pole pairs, the angular detection error AE was found through simulations in the same way as in Embodiment 1 for Samples 18~22 in which the positioning of the No. 1-1 through No. 1-4 magnetic sensor parts 31A~31D and the No. 2-1 through No. 2-4 magnetic sensor parts 32A~32D of the first through fourth magnetic sensor sets 3A~3D was caused to variously fluctuate. Positioning of the No. 1-1 through No. 1-4 magnetic sensor parts 31A~31D and simulation results for the angular detection error AE are shown in Table 3. In Table 3, the positions of the No. 1-1 through No. 1-4 magnetic sensor parts 31A~31D are expressed as numerical values of the electrical angle when the boundary between the first region AR1 and the eighth region AR8 is taken as 0° in the rotational angle detection device 10 shown in FIG. 3, and the first region AR1 is a region in the angular range of at least 0° and less than 360° (electrical angle), the second region AR2 is a region in the angular range of at least 360° and less than 720° (electrical angle), the third region AR3 is a region in the angular range of at least 720° and less than 1080° (electrical angle), the fourth region AR4 is a region in the angular range of at least 1080° and less than 1440° (electrical angle), the fifth region AR5 is a region in the angular range of at least 1440° and less than 1800° (electrical angle), the sixth region AR6 is a region in the angular range of at least 1800° and less than 2160° (electrical angle), the seventh region AR7 is a region in the angular range of at least 2160° and less than 2520° (electrical angle) and the eighth region AR8 is a region in the angular range of at least 2520° and less than 2880° (electrical angle).

TABLE 3

| | Positioning of first magnetic sensor part (electrical angle) | | | | |
|---|---|---|---|---|---|
| | No. 1-1 | No. 1-2 | No. 1-3 | No. 1-4 | AE |
| Sample 18 | 0 | 456 | 1140 | 2196 | 0.503 |
| Sample 19 | 60 | 456 | 1476 | 2160 | 0.517 |
| Sample 20 | 36 | 720 | 1536 | 2220 | 0.521 |
| Sample 21 | 36 | 816 | 1500 | 2160 | 0.525 |
| Sample 22 | 0 | 816 | 1476 | 2220 | 0.531 |
| Sample ref. | 0 | 36 | 60 | 96 | 1.521 |

As shown in Table 1, it was confirmed that compared to the Sample ref in which all of the first through fourth magnetic sensor sets 3A~3D are positioned in the first region AR1, in Samples 1~10 in which the first through fourth magnetic sensor sets 3A~3D are each positioned in regions different from each other, it is possible to reduce the angular detection error AE.

In addition, as shown in Table 2, it was confirmed that by positioning an arbitrarily selected two magnetic sensor sets among the first through fourth magnetic sensor sets 3A~3D in the same region and positioning the other two magnetic sensor sets in regions different from each other, it is possible to reduce the angular detection error AE (Samples 11~17).

Furthermore, in Samples 18~22 using the multipolar magnet 2 having eight pole pairs, it was confirmed that by having each of the first through fourth magnetic sensor sets 3A~3D positioned in mutually different regions, it is possible to reduce the angular detection error AE.

As is clear from the above-described results of Samples 1~22 and the results of the Sample ref., by having at least two of the magnetic sensor sets among the first through fourth magnetic sensor sets 3A~3D positioned in mutually different regions among the first through nth regions AR1~ARn and by having the four No. 1-1 through No. 1-4 magnetic sensor parts 31A~31D positioned at an angular spacing capable of reducing error components corresponding to at least third-order harmonic waves, it is possible to reduce the angular detection error AE and it can be inferred that it is possible to detect rotational angles with high accuracy.

DESCRIPTION OF SYMBOLS

1 Magnetic detection device
2 Multipolar magnet
3 Magnetic detection part
31 First magnetic detection part
31A No. 1-1 magnetic sensor part
31B No. 1-2 magnetic sensor part
31C No. 1-3 magnetic sensor part
31D No. 1-4 magnetic sensor part
32 Second magnetic detection part
32A No. 2-1 magnetic sensor part
32B No. 2-2 magnetic sensor part
32C No. 2-3 magnetic sensor part
32D No. 2-4 magnetic sensor part
3A First magnetic sensor set
3B Second magnetic sensor set
3C Third magnetic sensor set
3D Fourth magnetic sensor set
4 Arithmetic processing part
41 Corrected signal generation part
43 Rotational angle detection part
10 Rotational angle detection device
AS1 First corrected signal
AS2 Second corrected signal
DS1 First detection signal
DS2 Second detection signal

The invention claimed is:

1. A rotational angle detection device comprising:
a magnet with n pole pairs (where n is an integer that is at least 4) provided to be integrally rotatable with a rotating body, with the different magnetic poles arranged alternately in the circumferential direction;
magnetic detection parts, which are positioned in a region at the perimeter of the magnet and which output a first detection signal and a second detection signal in accordance with change in a magnetic field accompanying rotation of the magnet;
a corrected signal generation part that generates a first corrected signal and a second corrected signal in which error components included in the first detection signal and the second detection signal, respectively, output by the magnetic detection parts are reduced; and
a rotational angle detection part that detects the rotational angle of the rotating body based on the first corrected signal and the second corrected signal;
wherein the magnetic detection parts include at least a first magnetic detection part that outputs the first detection signal and a second magnetic detection part that outputs the second detection signal;
the waveform of the first detection signal and the waveform of the second detection signal have a phase difference of 90 degrees from each other;
each of the first magnetic detection part and the second magnetic detection part includes four first magnetic sensor parts and four second magnetic sensor parts;
the corrected signal generation part adds first sensor signals output from each of the four first magnetic sensor parts and adds second sensor signals output from each of the four second magnetic sensor parts, and through this, reduces the error components included in each of the first detection signal and the second detection signal;
the region at the perimeter of the magnet is divided into n sections along the circumference and includes first through nth regions arranged in order;
the four first magnetic sensor parts are positioned in different regions from each other among the first through nth regions; and
the four second magnetic sensor parts are positioned in different regions from each other among the first through nth regions.

2. The rotational angle detection device according to claim 1, wherein each of the first magnetic sensor parts and the second magnetic sensor parts includes a plurality of magnetoresistive elements.

3. The rotational angle detection device according to claim 2, wherein the magnetoresistive elements are Hall's elements, AMR elements, GMR elements or TMR elements.

4. A rotational angle detection device comprising:
a magnet with n pole pairs (where n is an integer that is at least 4) provided to be integrally rotatable with a rotating body, with the different magnetic poles arranged alternately in the circumferential direction;
magnetic detection parts, which are positioned in a region at the perimeter of the magnet and which output a first detection signal and a second detection signal in accordance with change in a magnetic field accompanying rotation of the magnet;
a corrected signal generation part that generates a first corrected signal and a second corrected signal in which error components included in the first detection signal and the second detection signal, respectively, output by the magnetic detection parts are reduced; and
a rotational angle detection part that detects the rotational angle of the rotating body based on the first corrected signal and the second corrected signal;
wherein the magnetic detection parts include at least a first magnetic detection part that outputs the first detection signal and a second magnetic detection part that outputs the second detection signal;
the waveform of the first detection signal and the waveform of the second detection signal have a phase difference of 90 degrees from each other;
each of the first magnetic detection part and the second magnetic detection part includes four first magnetic sensor parts and four second magnetic sensor parts;
the corrected signal generation part adds first sensor signals output from each of the four first magnetic sensor parts and adds second sensor signals output from each of the four second magnetic sensor parts, and through this, reduces the error components included in each of the first detection signal and the second detection signal;
the region at the perimeter of the magnet is divided into n sections along the circumference and includes first through nth regions arranged in order;
two of the first magnetic sensor parts selected from the four first magnetic sensor parts are positioned in one region among the first through nth regions; and
two of the second magnetic sensor parts selected from the four second magnetic sensor parts are positioned in one region among the first through nth regions.

5. A rotational angle detection device comprising:
a magnet with n pole pairs (where n is an integer that is at least 3) provided to be integrally rotatable with a rotating body, with the different magnetic poles arranged alternately in the circumferential direction;
magnetic detection parts, which are positioned in a region at the perimeter of the magnet and which output a first detection signal and a second detection signal in accordance with change in a magnetic field accompanying rotation of the magnet;

a corrected signal generation part that generates a first corrected signal and a second corrected signal in which error components included in the first detection signal and the second detection signal, respectively, output by the magnetic detection parts are reduced; and a rotational angle detection part that detects the rotational angle of the rotating body based on the first corrected signal and the second corrected signal;

wherein the magnetic detection parts include at least a first magnetic detection part that outputs the first detection signal and a second magnetic detection part that outputs the second detection signal;

the waveform of the first detection signal and the waveform of the second detection signal have a phase difference of 90 degrees from each other;

each of the first magnetic detection part and the second magnetic detection part includes a plurality of first magnetic sensor parts and a plurality of second magnetic sensor parts;

the corrected signal generation part adds first sensor signals output from each of the plurality of first magnetic sensor parts and adds second sensor signals output from each of the plurality of second magnetic sensor parts, and through this, reduces the error components included in each of the first detection signal and the second detection signal;

the region at the perimeter of the magnet is divided into n sections along the circumference and includes first through nth regions arranged in order;

at least two of the first magnetic sensor parts of the plurality of first magnetic sensor parts are positioned in different regions from each other among the first through nth regions; and at least two of the second magnetic sensor parts of the plurality of second magnetic sensor parts are positioned in different regions from each other among the first through nth regions;

the plurality of first magnetic sensor parts includes at least one group of two first magnetic sensor parts positioned at an angular spacing of $60+360 \times X°$ (where X is an integer that is at least 0 and not more than n−1) in electrical angle; and the plurality of second magnetic sensor parts includes at least one group of two second magnetic sensor parts positioned at an angular spacing of $60+360 \times X°$ (where X is an integer that is at least 0 and not more than n−1) in electrical angle.

6. The rotational angle detection device according to claim 5, wherein:

the plurality of first magnetic sensor parts includes at least two groups of two first magnetic sensor parts positioned at an angular spacing of $60+360 \times X°$ (where X is an integer that is at least 0 and not more than n−1) in electrical angle; and the plurality of second magnetic sensor parts includes at least two groups of two second magnetic sensor parts positioned at an angular spacing of $60+360 \times X°$ (where X is an integer that is at least 0 and not more than n−1) in electrical angle.

7. The rotational angle detection device according to claim 5, wherein:

the plurality of first magnetic sensor parts includes at least one group of two first magnetic sensor parts positioned at an angular spacing of $36+360 \times Y°$ (where Y is an integer that is at least 0 and not more than n−1) in electrical angle; and the plurality of second magnetic sensor parts includes at least one group of two second magnetic sensor parts positioned at an angular spacing of $36+360 \times Y°$ (where Y is an integer that is at least 0 and not more than n−1) in electrical angle.

* * * * *